(12) United States Patent
Wang et al.

(10) Patent No.: US 12,381,186 B2
(45) Date of Patent: *Aug. 5, 2025

(54) REDISTRIBUTION STRUCTURE FOR SEMICONDUCTOR DEVICE AND METHOD OF FORMING SAME

(71) Applicant: Taiwan Semiconductor Manufacturing Co., Ltd., Hsinchu (TW)

(72) Inventors: Po-Han Wang, Hsinchu (TW); Yu-Hsiang Hu, Hsinchu (TW); Hung-Jui Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/590,585

(22) Filed: Feb. 28, 2024

(65) Prior Publication Data

US 2024/0203949 A1 Jun. 20, 2024

Related U.S. Application Data

(63) Continuation of application No. 17/099,953, filed on Nov. 17, 2020, now Pat. No. 11,948,918.

(60) Provisional application No. 63/038,977, filed on Jun. 15, 2020.

(51) Int. Cl.
*H01L 21/00* (2006.01)
*H01L 21/56* (2006.01)
*H01L 23/00* (2006.01)
*H01L 25/065* (2023.01)

(52) U.S. Cl.
CPC .......... *H01L 25/0657* (2013.01); *H01L 21/56* (2013.01); *H01L 24/20* (2013.01)

(58) Field of Classification Search
None
See application file for complete search history.

(56) References Cited

U.S. PATENT DOCUMENTS

| | | |
|---|---|---|
| 8,987,922 B2 | 3/2015 | Yu et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,196,532 B2 | 11/2015 | Tu et al. |
| 9,196,559 B2 | 11/2015 | Tsai et al. |

(Continued)

FOREIGN PATENT DOCUMENTS

| CN | 111033732 A | 4/2020 |
|---|---|---|
| CN | 111052372 A | 4/2020 |

(Continued)

*Primary Examiner* — Nicholas J Tobergte
(74) *Attorney, Agent, or Firm* — Slater Matsil, LLP

(57) ABSTRACT

A semiconductor device having a redistribution structure and a method of forming the same are provided. A semiconductor device includes a semiconductor structure, a redistribution structure over and electrically coupled the semiconductor structure, and a connector over and electrically coupled to the redistribution structure. The redistribution structure includes a base via and stacked vias electrically interposed between the base via and the connector. The stacked vias are laterally spaced apart from the base via.

20 Claims, 32 Drawing Sheets

(56) References Cited

U.S. PATENT DOCUMENTS

| | | |
|---|---|---|
| 9,257,333 B2 | 2/2016 | Lu et al. |
| 9,263,511 B2 | 2/2016 | Yu et al. |
| 9,263,839 B2 | 2/2016 | Chen et al. |
| 9,275,924 B2 | 3/2016 | Wang et al. |
| 9,275,925 B2 | 3/2016 | Chen et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,978,731 B1 | 5/2018 | Kim |
| 10,103,038 B1 | 10/2018 | Yoo et al. |
| 11,948,918 B2 * | 4/2024 | Wang .................. H01L 23/5226 |
| 2006/0244134 A1 | 11/2006 | Inagaki et al. |
| 2009/0193374 A1 | 7/2009 | Fujimoto et al. |
| 2014/0093999 A1 | 4/2014 | Teh et al. |
| 2014/0264933 A1 | 9/2014 | Yu et al. |
| 2015/0187695 A1 | 7/2015 | Yu et al. |
| 2017/0032977 A1 | 2/2017 | Chen et al. |
| 2017/0202083 A1 | 7/2017 | Baek et al. |
| 2018/0012774 A1 | 1/2018 | Hu |
| 2018/0012843 A1 | 1/2018 | Chen et al. |
| 2018/0068968 A1 | 3/2018 | Chiu et al. |
| 2018/0366411 A1 | 12/2018 | Suk et al. |
| 2019/0006283 A1 | 1/2019 | Wang et al. |
| 2019/0067034 A1 | 2/2019 | Pachamuthu et al. |
| 2019/0103353 A1 | 4/2019 | Liu et al. |
| 2019/0206755 A1 | 7/2019 | Choi et al. |
| 2019/0378809 A1 | 12/2019 | Chen et al. |
| 2020/0083201 A1 | 3/2020 | Suk et al. |
| 2020/0091097 A1 | 3/2020 | Hung et al. |
| 2020/0118953 A1 | 4/2020 | Yu et al. |
| 2020/0194393 A1 | 6/2020 | Wu et al. |
| 2020/0365545 A1 | 11/2020 | Joo et al. |
| 2022/0020714 A1 | 1/2022 | Choi et al. |
| 2022/0068869 A1 | 3/2022 | Lee et al. |
| 2022/0102282 A1 | 3/2022 | Suk et al. |

FOREIGN PATENT DOCUMENTS

| | | |
|---|---|---|
| JP | 2011044739 A | 3/2011 |
| JP | 2014086525 A | 5/2014 |
| JP | 2016058483 A | 4/2016 |
| WO | 2019112953 A1 | 6/2019 |

* cited by examiner

REDISTRIBUTION STRUCTURE FOR SEMICONDUCTOR DEVICE AND METHOD OF FORMING SAME

PRIORITY CLAIM AND CROSS-REFERENCE

This application is a continuation of U.S. patent Ser. No. 17/099,953, filed on Nov. 17, 2020, now U.S. Pat. No. 11,948,918, issued Apr. 2, 2024, which claims the benefit of U.S. Provisional Application No. 63/038,977, filed on Jun. 15, 2020, each application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
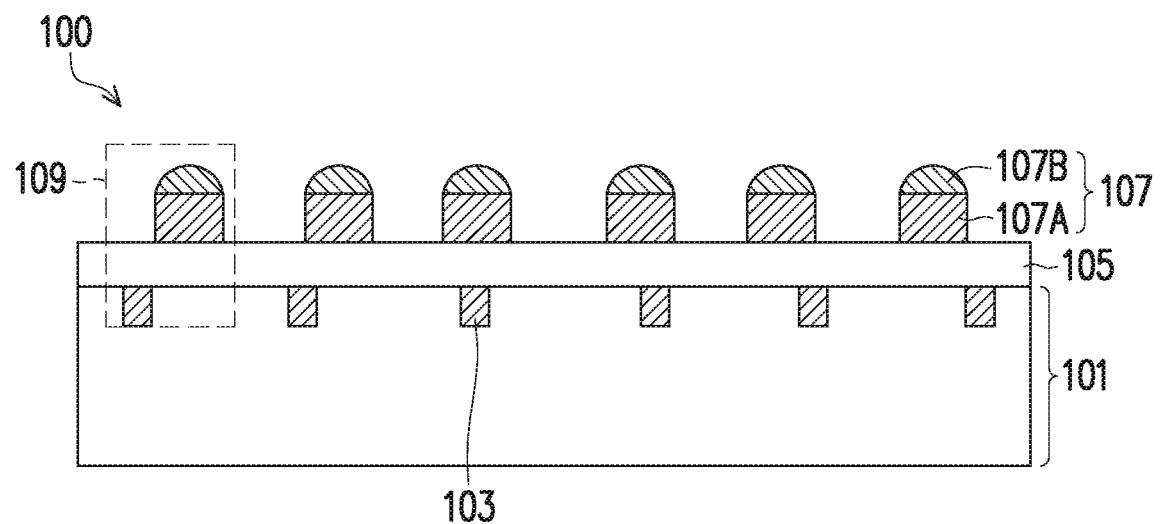
FIGS. 1A and 1B illustrates cross-sectional and top views of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a redistribution structure of a semiconductor device, and a method of forming the same. The semiconductor device may be an integrated circuit die structure, an interposer, an integrated circuit package, or the like. Various embodiments presented herein allow for forming redistribution structures comprising stacked-via and/or staggered-via configurations. Various embodiments presented herein allow for reducing a strain within a redistribution structure, reducing or eliminating the generation of defects in the redistribution structure due to the strain, improving flexibility of circuit design for the redistribution structure, improving routing efficiency of the redistribution structure, and improving the reliability of a semiconductor device comprising the redistribution structure.

Figure 1B:
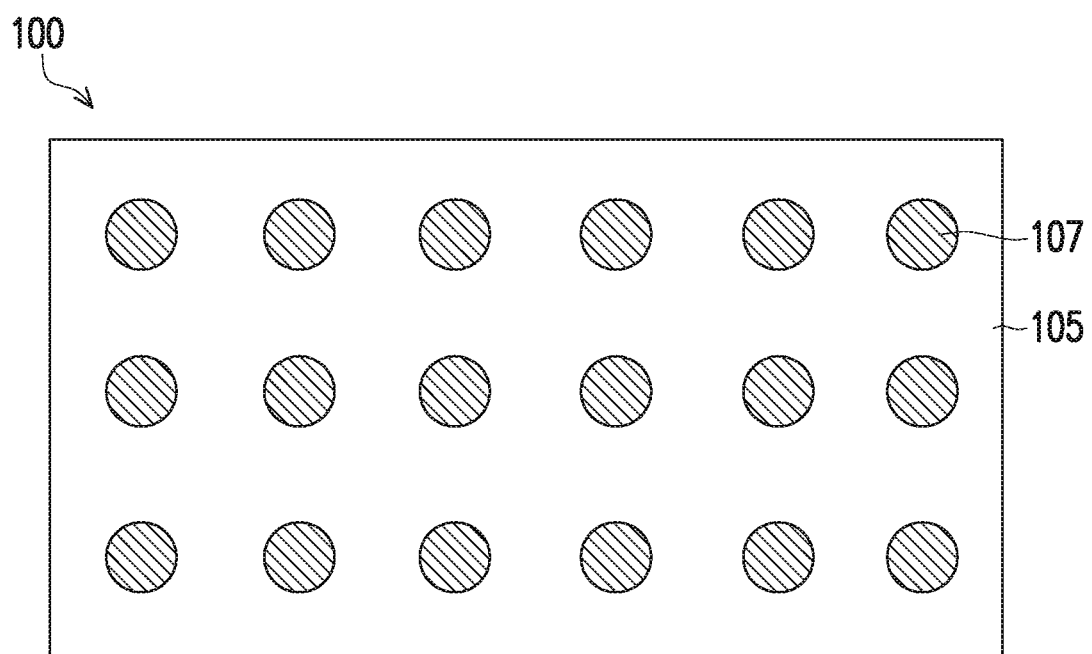

FIGS. 1A and 1B illustrates cross-sectional and top views, respectively, of a semiconductor device 100 in accordance with some embodiments. The semiconductor device 100 comprises a semiconductor structure 101. In some embodiments, the semiconductor structure 101 may comprise an integrated circuit die, an interposer, a packaged semiconductor structure, or the like. In some embodiments, the semiconductor structure 101 comprises connectors 103, which are configured to provide electrical connections to an electrical circuitry within the semiconductor structure 101. The semiconductor device 100 further comprises a redistribution structure 105 over the semiconductor structure 101. In some embodiments, the redistribution structure 105 comprises a plurality of insulating and conductive layers (not individually illustrated). The connectors 103 electrically couple the redistribution structure 105 to the electrical circuitry within the semiconductor structure 101. In some embodiments, the connectors 103 comprise a conductive material such as, for example, copper, or the like.

The semiconductor device 100 further comprises connectors 107 over and in electrical contact with the redistribution structure 105. The connectors 107 are configured to electrically connect the semiconductor device 100 to external electrical components. In some embodiments, the connectors 107 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The connectors 107 may include a conductive material such as solder, copper, aluminum, gold, nickel, silver, palladium, tin, the like, or a combination thereof. In the illustrated embodiment, the connectors 107 comprise conductive pillars 107A and conductive cap layers 107B. In some embodiments, the conductive pillars 170A may comprise a conductive material such as, for example, copper, or the like. In some embodiments, the conductive pillars 170A may be solder free. The conductive cap layers 107B may comprise a solder material.

Figure 2:
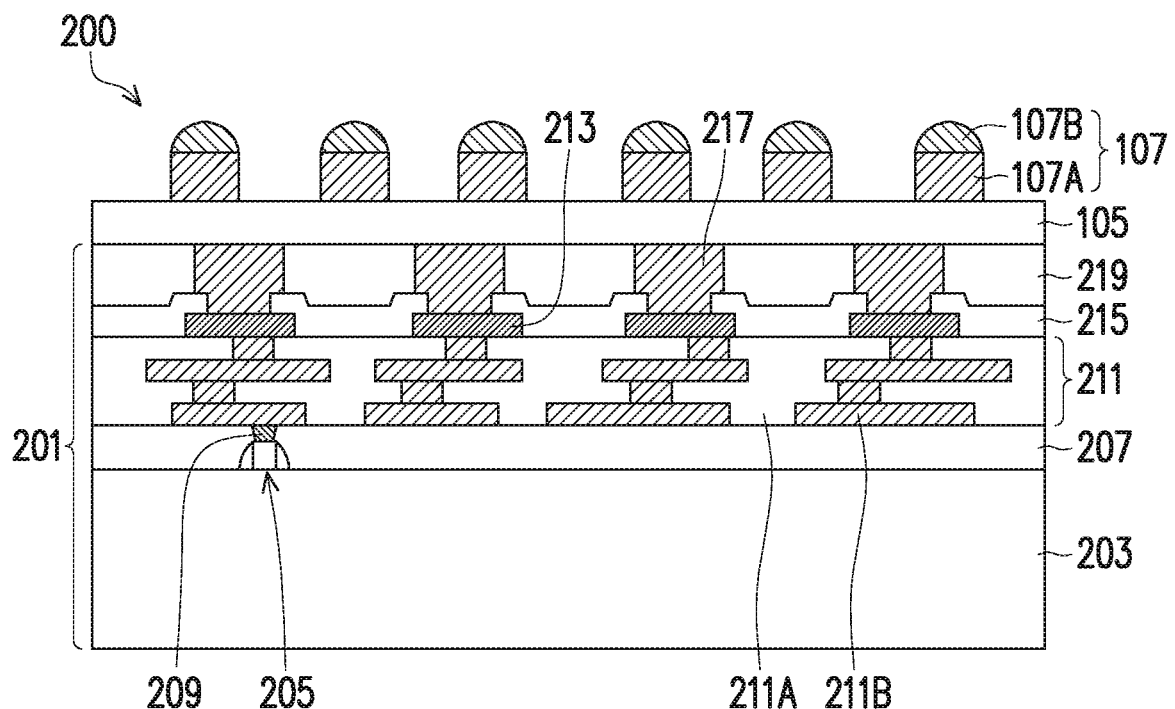
FIG. 2 illustrates a cross-sectional view of a semiconductor device in accordance with some embodiments.

FIG. 2 illustrates a cross-sectional view of a semiconductor device 200 in accordance with some embodiments. The semiconductor device 200 is similar to the semiconductor device 100 illustrated above with reference to FIGS. 1A and 1B, with similar features being labeled with similar numerical references, and the descriptions of the similar features are not repeated herein. In some embodiments, the semiconductor device 200 is implemented as the semiconductor device 100 (see FIGS. 1A and 1B), such that an integrated circuit die 201 of the semiconductor device 200 is implemented as the semiconductor structure 101 of the semiconductor device 100 (see FIGS. 1A and 1B). The integrated circuit die 201 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 201 may be formed in a wafer, which may include different device regions that are singulated in subsequent steps to form a plurality of integrated circuit dies. The integrated circuit die 201 may be processed according to applicable manufacturing processes to form integrated circuits. For example, the integrated circuit die 201 includes a semiconductor substrate 203, such as silicon, doped or undoped, or an active layer of a semiconductor-on-insulator (SOI) substrate. The semiconductor substrate 203 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 203 has an active surface (e.g., the surface facing upwards in FIG. 2), sometimes called a front side, and an inactive surface (e.g., the surface facing downwards in FIG. 2), sometimes called a back side.

Devices (represented by a transistor) 205 may be formed at the front surface of the semiconductor substrate 203. The devices 205 may be active devices (e.g., transistors, diodes, etc.), capacitors, resistors, or the like. An inter-layer dielectric (ILD) 207 is over the front surface of the semiconductor substrate 203. The ILD 207 surrounds and may cover the devices 205. The ILD 207 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), the like, or combinations thereof.

Conductive plugs 209 extend through the ILD 207 to electrically and physically couple to the devices 205. For example, when the devices 205 are transistors, the conductive plugs 209 may couple the gates and source/drain regions of the transistors. The conductive plugs 209 may be formed of tungsten, cobalt, nickel, copper, silver, gold, aluminum, the like, or combinations thereof.

An interconnect structure 211 is over the ILD 207 and conductive plugs 209. The interconnect structure 211 interconnects the devices 205 to form an integrated circuit. The interconnect structure 211 may be formed by, for example, metallization patterns 211B in dielectric layers 211A on the ILD 207. The metallization patterns 211B include metal lines and vias formed in one or more low-k dielectric layers 211A. The metallization patterns 211B of the interconnect structure 211 are electrically coupled to the devices 205 by the conductive plugs 209. In some embodiments, interconnect structure 211 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like).

The integrated circuit die 201 further includes pads 213, such as aluminum pads, to which external connections are made. The pads 213 are on the active side of the integrated circuit die 201, such as in and/or on the interconnect structure 211. A passivation layer 215 is on the integrated circuit die 201, such as on portions of the interconnect structure 211 and the pads 213. In some embodiments, the passivation layer 215 comprises one or more layers of silicon oxide, silicon nitride, silicon oxynitride, the like, or a combination thereof. Openings extend through the passivation layer 215 to the pads 213.

Die connectors 217, such as conductive pillars (for example, formed of a metal such as copper), extend through the openings in the passivation layer 215 and are physically and electrically coupled to respective ones of the pads 213. The die connectors 217 may be formed by, for example, plating, or the like. The die connectors 217 are electrically coupled to the respective integrated circuits of the integrated circuit die 201. In the illustrated embodiment, the die connectors 217 are implemented as the connectors 103 illustrated in FIG. 1A.

Optionally, solder regions (e.g., solder balls or solder bumps) may be disposed on the die connectors 217. The solder balls may be used to perform chip probe (CP) testing on the integrated circuit die 201. The CP testing may be performed on the integrated circuit die 201 to ascertain whether the integrated circuit die 201 is a known good die (KGD). Thus, only integrated circuit dies 201, which are KGDs, undergo subsequent processing, and dies, which fail the CP testing, are not processed. After testing, the solder regions may be removed in subsequent processing steps.

An insulating layer 219 may (or may not) be on the active side of the integrated circuit die 201, such as on the passivation layer 215 and the die connectors 217. The insulating layer 219 laterally encapsulates the die connectors 217, and the insulating layer 219 is laterally coterminous with the integrated circuit die 201. In some embodiments, the insulating layer 219 may bury the die connectors 217, such that the topmost surface of the insulating layer 219 is above the topmost surfaces of the die connectors 217. In some embodiments where solder regions are disposed on the die connectors 217, the insulating layer 219 may bury the solder regions as well. Alternatively, the solder regions may be removed prior to forming the insulating layer 219.

The insulating layer 219 may be a polymer such as polybenzoxazole (PBO), polyimide, benzocyclobutene (BCB), or the like; a nitride such as silicon nitride or the like; an oxide such as silicon oxide, PSG, BSG, BPSG, or the like; the like, or a combination thereof. The insulating layer 219 may be formed, for example, by spin coating, lamination, chemical vapor deposition (CVD), or the like. In some embodiments, the die connectors 217 are exposed through the insulating layer 219 during formation of the integrated circuit die 201. In other embodiments, the die connectors 217 remain buried and are exposed during a subsequent process for forming the redistribution structure 105. Exposing the die connectors 217 may remove any solder regions that may be present on the die connectors 217. In some embodiments, a planarization process such as, for example, a chemical mechanical polishing (CMP) process is performed on the integrated circuit die 201 before forming the redistribution structure 105.

In some embodiments, the integrated circuit die 201 is a stacked device that includes multiple semiconductor substrates. For example, the integrated circuit die 201 may be a memory device such as a hybrid memory cube (HMC) module, a high bandwidth memory (HBM) module, or the like that includes multiple memory dies. In such embodiments, the integrated circuit die 201 includes multiple semiconductor substrates interconnected by through-substrate vias (TSVs). Each of the semiconductor substrates may (or may not) have an interconnect structure.

Figure 3:
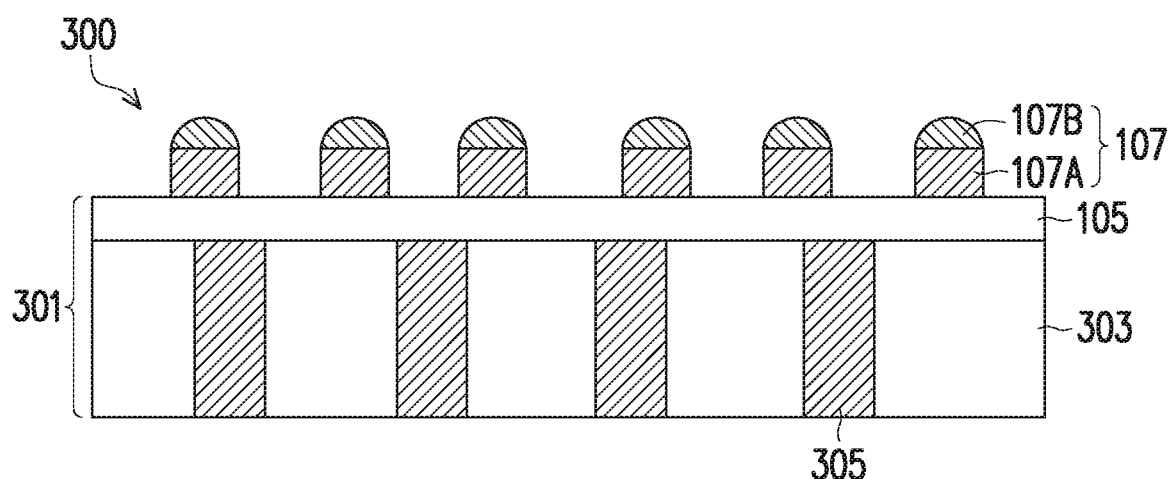
FIG. 3 illustrates a cross-sectional view of a semiconductor device in accordance with some embodiments.

FIG. 3 illustrates a cross-sectional view of a semiconductor device 300 in accordance with some embodiments. The semiconductor device 300 is similar to the semiconductor device 100 illustrated above with reference to FIGS. 1A and 1B, with similar features being labeled with similar numerical references, and the descriptions of the similar features are not repeated herein. In some embodiments, the semiconductor device 300 is implemented as the semiconductor device 100 (see FIGS. 1A and 1B), such that an interposer 301 of the semiconductor device 300 is implemented as the semiconductor structure 101 of the semiconductor device 100 (see FIGS. 1A and 1B).

The interposer 301 may be formed in a wafer, which is singulated in subsequent steps to form a plurality of interposers. The interposer 301 may be processed according to applicable manufacturing processes. For example, the interposer 301 includes a semiconductor substrate 303. In some embodiments, the semiconductor substrate 303 is similar to the semiconductor substrate 203 described above with reference to FIG. 2, and the description is not repeated herein. The interposer 301 may (may not) comprise an interconnect structure. The interposer 301 may (may not) comprise active and/or passive devices. In some embodiments, the interposer comprises TSVs 305 extending through the substrate 303. TSVs 305 may comprise a conductive material such as, for example, copper, or the like. In the illustrated embodiment, the TSVs 305 are implemented as the connectors 103 of the semiconductor device 100 (see FIGS. 1A and 1B). In some embodiments, a planarization process such as, for example, a CMP process is performed on the interposer 301 before forming the redistribution structure 105.

Figure 4:
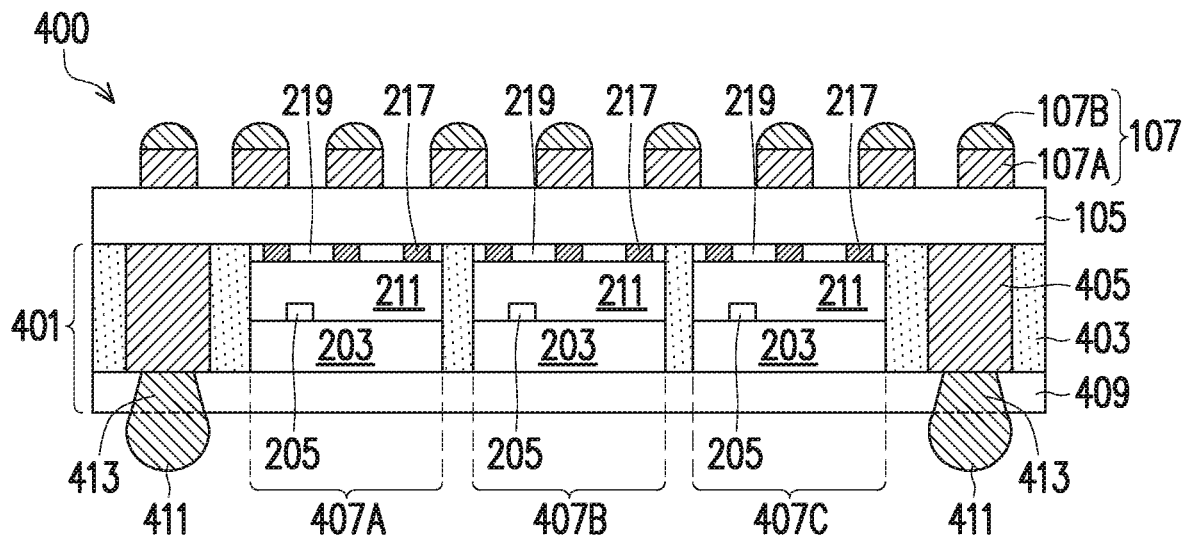
FIG. 4 illustrates a cross-sectional view of a semiconductor device in accordance with some embodiments.

FIG. 4 illustrates a cross-sectional view of a semiconductor device 400 in accordance with some embodiments. The semiconductor device 400 is similar to the semiconductor device 100 illustrated above with reference to FIGS. 1A and 1B, with similar features being labeled with similar numerical references, and the descriptions of the similar features are not repeated herein. In some embodiments, the semiconductor device 400 is implemented as the semiconductor device 100 (see FIGS. 1A and 1B), such that a packaged structure 401 of the semiconductor device 400 is implemented as the semiconductor structure 101 of the semiconductor device 100 (see FIGS. 1A and 1B).

The packaged structure 401 comprises an encapsulant 403. The encapsulant 403 may be a molding compound, epoxy, or the like. Through vias (TVs) 405 are embedded in the encapsulant 403 and extend from an upper side of the encapsulant 403 to a lower side of the encapsulant 403. Integrated circuit dies 407A, 407B, and 407C are embedded into the encapsulant 403 between adjacent TVs 405. The integrated circuit dies 407A, 407B, and 407C may be similar to the integrated circuit die 201 described above with reference to FIG. 2, with similar features being labeled with similar numerical references, and descriptions of the similar features are not repeated herein.

A backside structure 409 is formed on the lower side of the encapsulant 403 and backsides of the integrated circuit dies 407A, 407B, and 407C. In some embodiments, the backside structure 409 is an insulating layer and may be formed using similar materials and methods as the insulating layer 219 described above with reference to FIG. 2, and the description is not repeated herein. In other embodiments, the backside structure 409 is a redistribution structure comprising a plurality of insulating and conductive layers (not individually shown). The packaged structure 401 further comprises connectors 411 on the lower side of the encapsulant 403. In an embodiment when the backside structure 409 is an insulating layer, the connectors 411 comprise portions 413 that extend through the backside structure 409 and are coupled to respective TVs 405. In another embodiment when the backside structure 409 is a redistribution structure, the connectors 411 are electrically and mechanically coupled to a lower surface of the backside structure 409. In such embodiments, the connectors 411 do not comprise the portions 413. In the illustrated embodiment, the die connectors 217 and the TVs 405 are implemented as the connectors 103 of the semiconductor device 100 (see FIGS. 1A and 1B).

Referring further to FIG. 4, process steps for forming the semiconductor device 400 may include: forming the backside structure 409 over a carrier substrate; forming the TVs 405 over the backside structure 409; attaching the integrated circuit dies 407A, 407B, and 407C to the backside structure 409; encapsulating the TVs 405 and the integrated circuit dies 407A, 407B, and 407C in the encapsulant 403; planarizing the encapsulant 403 to expose the TVs 405 and the die connectors 217; forming the redistribution structure 105 and the connectors 107 over the integrated circuit dies 407A, 407B, and 407C and the encapsulant 403; de-bonding the carrier substrate from the resulting structure; forming the connectors 411 on the backside structure 409; and dicing the resulting structure into individual devices such as the semiconductor device 400.

Figure 5:
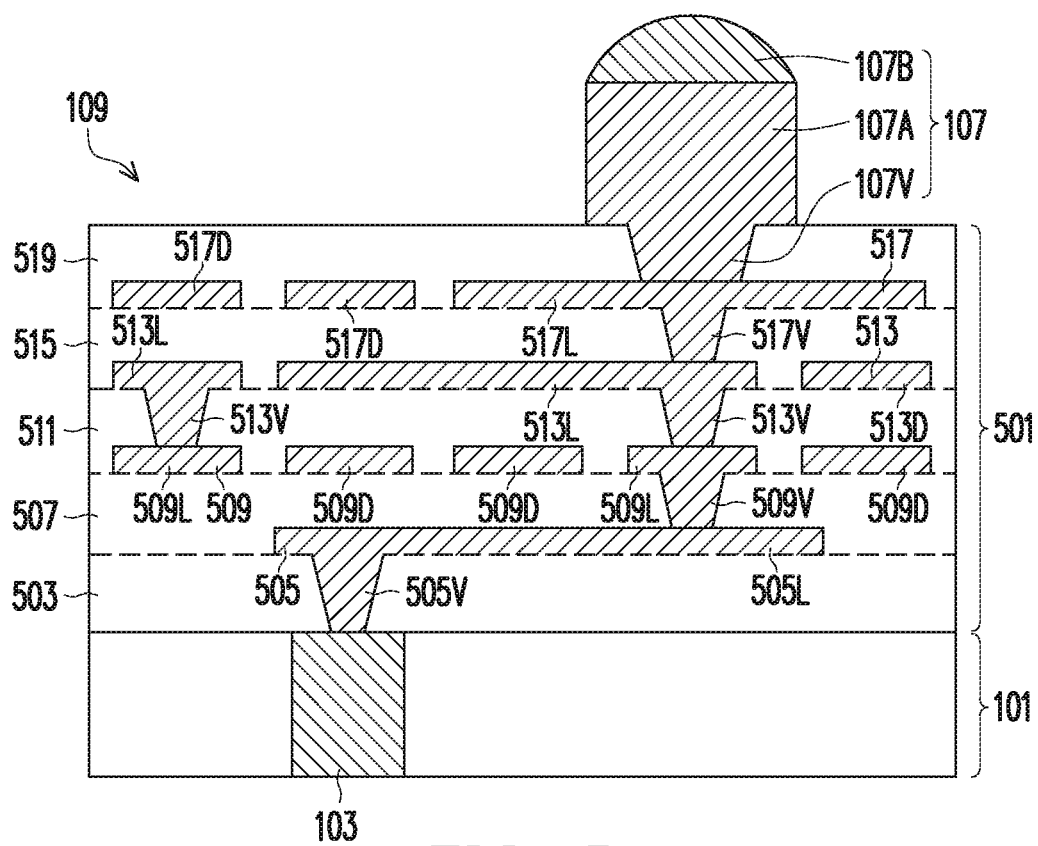
FIGS. 5-62 illustrate cross-sectional views of redistribution structures in accordance with some embodiments.

FIG. 5 illustrates a cross-sectional view of a portion 109 of the redistribution structure 105 (see FIG. 1A) in accordance with some embodiments. In the illustrated embodiment, a redistribution structure 501 is implemented as the redistribution structure 105 of the semiconductor device 100 (see FIGS. 1A and 1B). The redistribution structure 501 includes insulating layers 503, 507, 511, 515 and 519; and metallization patterns 505, 509, 513 and 517. The metallization patterns may also be referred to as redistribution layers or redistribution lines. The redistribution structure 501 is shown as an example having four layers of metallization patterns. More or fewer insulating layers and metallization patterns may be formed in the redistribution structure 501. If fewer insulating layers and metallization patterns are to be formed, steps and processes discussed below may be omitted. If more insulating layers and metallization patterns are to be formed, steps and processes discussed below may be repeated.

In some embodiments, the formation of the redistribution structure 501 starts with depositing the insulating layer 503 over the semiconductor structure 101. In some embodiments, the insulating layer 503 is formed of a photosensitive material such as PBO, polyimide, BCB, the like, or a combination thereof, which may be patterned using a lithography mask. The insulating layer 503 may be formed by spin coating, lamination, CVD, the like, or a combination thereof. The insulating layer 503 is then patterned. The patterning forms openings exposing portions of the connectors 103. The patterning may be by an acceptable process, such as by exposing and developing the insulating layer 503 to light when the insulating layer 503 is a photo-sensitive material or by etching using, for example, an anisotropic etch.

After forming the insulating layer 503, the metallization pattern 505 is formed. The metallization pattern 505 includes portions (such as conductive lines or traces 505L) on and extending along the major surface of the insulating layer 503. The metallization pattern 505 further includes portions (such as conductive vias 505V) extending through the insulating layer 503 to physically and electrically couple to the respective connectors 103.

As an example to form the metallization pattern 505, a seed layer is formed over the insulating layer 503 and in the openings extending through the insulating layer 503. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 505. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. In some embodiments, the conductive material is formed in a conformal manner such that the conductive material partially fills the openings through the photoresist. The combination of the conductive material and underlying portions of the seed layer form the metallization pattern 505. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

After forming the metallization pattern 505, the insulating layer 507 is deposited on the metallization pattern 505 and the insulating layer 503. The insulating layer 507 may be formed using similar materials and methods as the insulating layer 503 and the description is not repeated herein.

After forming the insulating layer 507, the metallization pattern 509 is formed. The metallization pattern 509 includes portions (such as conductive lines or traces 509L) on and extending along the major surface of the insulating layer 507. The metallization pattern 509 further includes portions (such as conductive vias 509V) extending through the insulating layer 507 to physically and electrically couple to the metallization pattern 505. The metallization pattern 509 may be formed using similar materials and methods as the metallization pattern 505 and the description is not repeated herein. In some embodiments, the metallization pattern 509 further includes dummy conductive lines or traces 509D. In some embodiments, the dummy conductive lines or traces 509D are formed to reduce negative effects (for example, loading effects) during the plating process for forming the metallization pattern 509. The dummy conductive lines or traces 509D are isolated from the rest of the conductive features of the redistribution structure 501 by respective insulating layers of the redistribution structure 501. Accordingly, the dummy conductive lines or traces 509D are electrically floating in the redistribution structure 501.

After forming the metallization pattern 509, the insulating layer 511 is deposited on the metallization pattern 509 and the insulating layer 507. The insulating layer 511 may be formed using similar materials and methods as the insulating layer 503 and the description is not repeated herein.

After forming the insulating layer 511, the metallization pattern 513 is formed. The metallization pattern 513 includes portions (such as conductive lines or traces 513L) on and extending along the major surface of the insulating layer 511. The metallization pattern 513 further includes portions (such as conductive vias 513V) extending through the insulating layer 511 to physically and electrically couple to the metallization pattern 509. The metallization pattern 513 may be formed using similar materials and methods as the metallization pattern 505 and the description is not repeated herein. In some embodiments, the metallization pattern 513 further includes dummy conductive lines or traces 513D. In some embodiments, the dummy conductive lines or traces 513D are formed to reduce negative effects (for example, loading effects) during the plating process for forming the metallization pattern 513. The dummy conductive lines or traces 513D are isolated from the rest of the conductive features of the redistribution structure 501 by respective insulating layers of the redistribution structure 501. Accordingly, the dummy conductive lines or traces 513D are electrically floating in the redistribution structure 501.

After forming the metallization pattern 513, the insulating layer 515 is deposited on the metallization pattern 513 and the insulating layer 511. The insulating layer 515 may be formed using similar materials and methods as the insulating layer 503 and the description is not repeated herein.

After forming the insulating layer 515, the metallization pattern 517 is formed. The metallization pattern 517 includes portions (such as conductive lines or traces 517L) on and extending along the major surface of the insulating layer 515. The metallization pattern 517 further includes portions (such as conductive vias 517V) extending through the insulating layer 515 to physically and electrically couple to the metallization pattern 513. The metallization pattern 517 may be formed using similar materials and methods as the metallization pattern 505 and the description is not repeated herein. In some embodiments, the metallization pattern 517 further includes dummy conductive lines or traces 517D. In some embodiments, the dummy conductive lines or traces 517D are formed to reduce negative effects (for example, loading effects) during the plating process for forming the metallization pattern 517. The dummy conductive lines or traces 517D are isolated from the rest of the conductive features of the redistribution structure 501 by respective insulating layers of the redistribution structure 501. Accordingly, the dummy conductive lines or traces 517D are electrically floating in the redistribution structure 501.

After forming the metallization pattern 517, the insulating layer 519 is deposited on the metallization pattern 517 and the insulating layer 515. The insulating layer 519 may be formed using similar materials and methods as the insulating layer 503 and the description is not repeated herein.

After forming the redistribution structure 501, the connectors 107 are formed over the redistribution structure 501. In some embodiments, the conductive pillars 107A comprises a via portions 107V that extends through the insulating layer 519 to physically and electrically couple to the metallization pattern 517.

Referring further to FIG. 5, in some embodiments, the vias 505V, 509V, 513V, and 517V have sloped sidewalls. In some embodiments, at least one of the vias 505V, 509V, 513V, and 517V is laterally shifted with respect to the via portion 107V of the connector 107. In the illustrated embodiment, the via 505V and the connector 103 are laterally shifted with respect to the via portion 107V of the connector 107, while the vias 509V, 513V, and 517V are vertically stacked directly below the via portion 107V of the connector 107. By stacking and staggering the vias 505V, 509V, 513V, and 517V in the redistribution structure 501 as described above, a strain within the redistribution structure 501 is reduced. Accordingly, generation of defects in the redistribution structure 501 due to the strain is reduced or eliminated, which improves flexibility of circuit design for the redistribution structure, routing efficiency of the redistribution structure, and the reliability of a semiconductor device comprising the redistribution structure 501.

Figure 6:
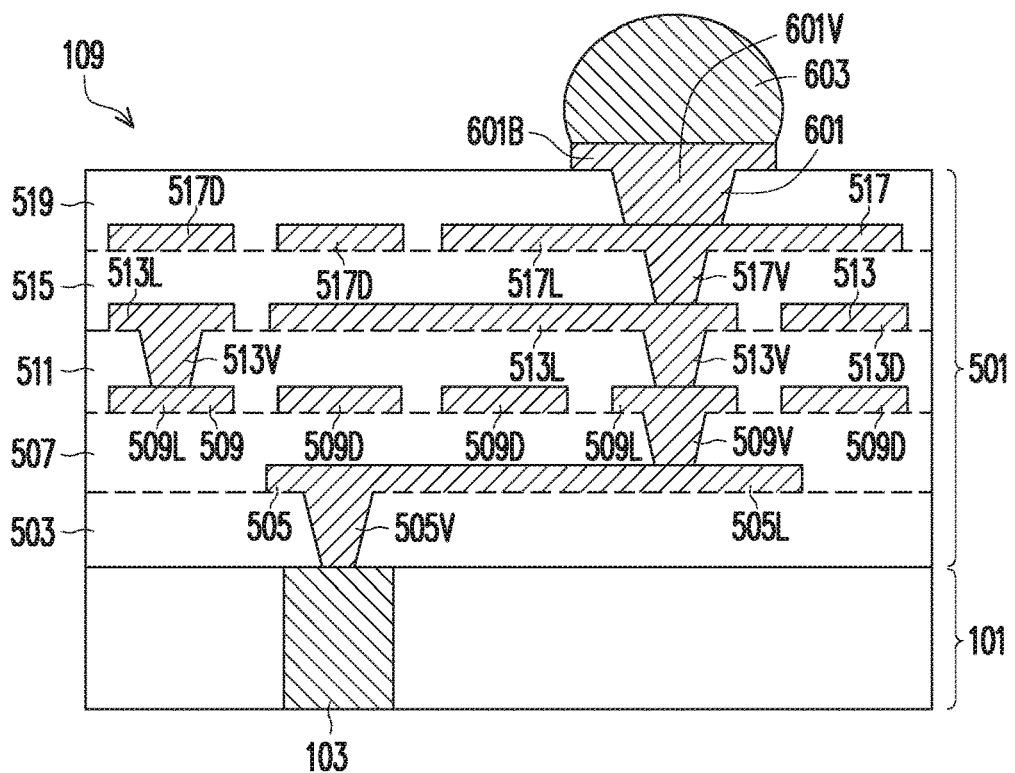

FIG. 6 illustrates a cross-sectional view of a portion 109 of the redistribution structure 105 (see FIG. 1A) in accordance with some embodiments. The structure illustrated in FIG. 6 is similar to the structure illustrated in FIG. 5, with similar features being labeled by similar numerical references, and descriptions of the similar features are not repeated herein. In the illustrated embodiment, after forming the redistribution structure 501, under-bump metallizations (UBMs) 601 are formed for external connection to the redistribution structure 501. The UBMs 601 have bump portions 601B on and extending along the major surface of the insulating layer 519, and have via portions 601V extending through the insulating layer 519 to physically and electrically couple to the metallization pattern 517. After forming the UBMs 601, connectors 603 are formed on the UBMs 601. In some embodiments, the connectors 603 compose solder balls, BGA connectors, or the like.

Figure 7:
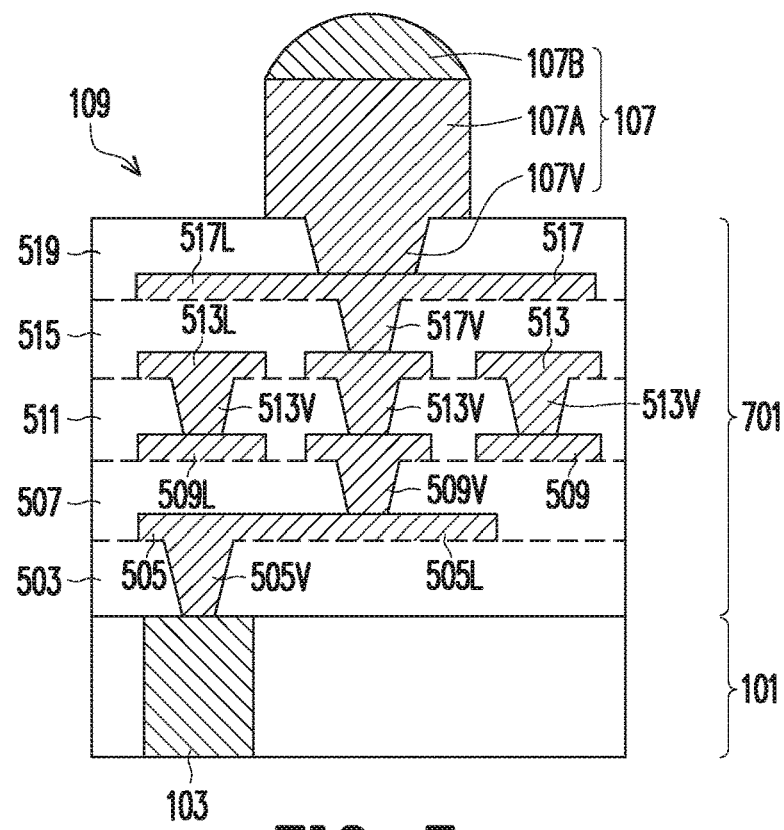

FIG. 7 illustrates a cross-sectional view of a portion 109 of the redistribution structure 105 of the semiconductor device 100 (see FIG. 1A) in accordance with some embodiments. In the illustrated embodiment, a redistribution structure 701 is implemented as the redistribution structure 105 of the semiconductor device 100 (see FIG. 1A). The redistribution structure 701 includes insulating layers 503, 507, 511, 515 and 519; and metallization patterns 505, 509, 513 and 517. The structure of FIG. 7 is similar to the structure of FIG. 5, with similar features being labeled with similar numerical references, and descriptions of the similar features are not repeated herein. In some embodiments, the redistribution structure 701 may be formed in a similar manner as the redistribution structure 501 described above with reference to FIG. 5, and the description is not repeated herein. In the distinction with the redistribution structure 501, the redistribution structure 701 does not comprise dummy conductive lines or traces (such as the dummy conductive lines or traces 509D, 513D, and 517D illustrated in FIG. 5).

In some embodiments, at least one of the vias 505V, 509V, 513V, and 517V is laterally shifted with respect to the rest of the vias. In the illustrated embodiment, the via 505V and the connector 103 are vertically stacked, such that the via 505V fully lands on the connector. The via 505V and the connector 103 are laterally shifted with respect to the vias 509V, 513V, and 517V, and the via portion 107V of the connector 107, while the vias 509V, 513V, and 517V are vertically stacked directly below the via portion 107V of the connector 107. By stacking and staggering the vias 505V, 509V, 513V, and 517V in the redistribution structure 701 as described above, a strain within the redistribution structure 701 is reduced. Accordingly, generation of defects in the redistribution structure 701 due to the strain is reduced or eliminated, which improves flexibility of circuit design for the redistribution structure, routing efficiency of the redistribution structure, and the reliability of a semiconductor device comprising the redistribution structure 701.

Figure 8:
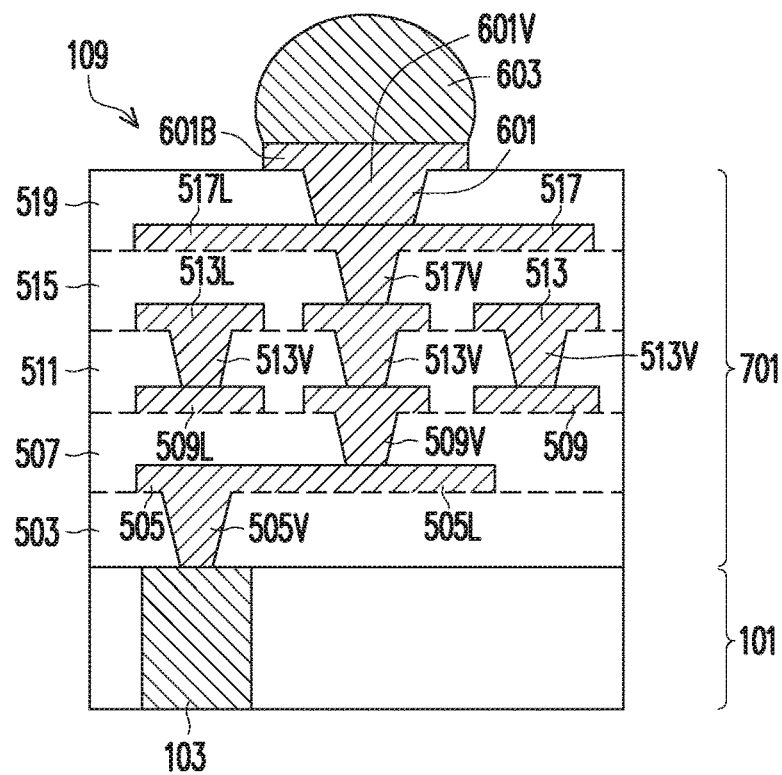

FIG. 8 illustrates a cross-sectional view of a portion 109 of the redistribution structure 105 (see FIG. 1A) in accordance with some embodiments. The structure illustrated in FIG. 8 is similar to the structure illustrated in FIG. 7, with similar features being labeled by similar numerical references, and descriptions of the similar features are not repeated herein. In the illustrated embodiment, after forming the redistribution structure 701, UBMs 601 and connectors 603 are formed over the redistribution structure 701 as described above with reference to FIG. 6, and the description is not repeated herein.

Figure 9:
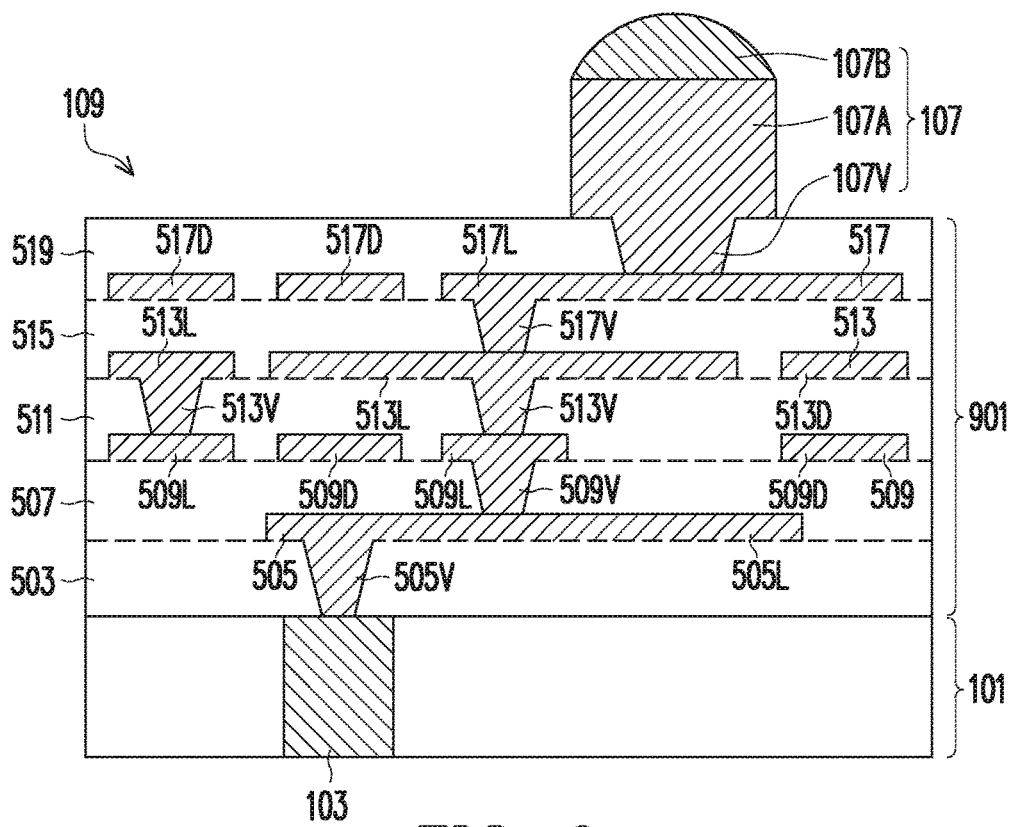

FIG. 9 illustrates a cross-sectional view of a portion 109 of the semiconductor device 100 (see FIG. 1A) in accordance with some embodiments. In the illustrated embodiment, a redistribution structure 901 is implemented as the redistribution structure 105 of the semiconductor device 100 (see FIG. 1A). The redistribution structure 901 includes insulating layers 503, 507, 511, 515 and 519; and metallization patterns 505, 509, 513 and 517. The structure of FIG. 9 is similar to the structure of FIG. 5, with similar features being labeled with similar numerical references, and descriptions of the similar features are not repeated herein. In some embodiments, the redistribution structure 901 may be formed in a similar manner as the redistribution structure 501 described above with reference to FIG. 5, and the description is not repeated herein. In some embodiments, the redistribution structure 901 comprises dummy conductive lines or traces 509D, 513D and 517D.

In the illustrated embodiment, the via 505V is over and fully lands on the connector 103. The via 505V is laterally shifted with respect to the vias 509V, 513V, and 517V, and with respect to the via portion 107V of the connector 107. The vias 509V, 513V, and 517V are vertically stacked and are laterally shifted with respect to the via portion 107V of the connector 107. By stacking and staggering the vias 505V, 509V, 513V, and 517V in the redistribution structure 901 as described above, a strain within the redistribution structure 901 is reduced. Accordingly, generation of defects in the redistribution structure 901 due to the strain is reduced or eliminated, which improves flexibility of circuit design for the redistribution structure, routing efficiency of the redistribution structure, and the reliability of a semiconductor device comprising the redistribution structure 901.

Figure 10:
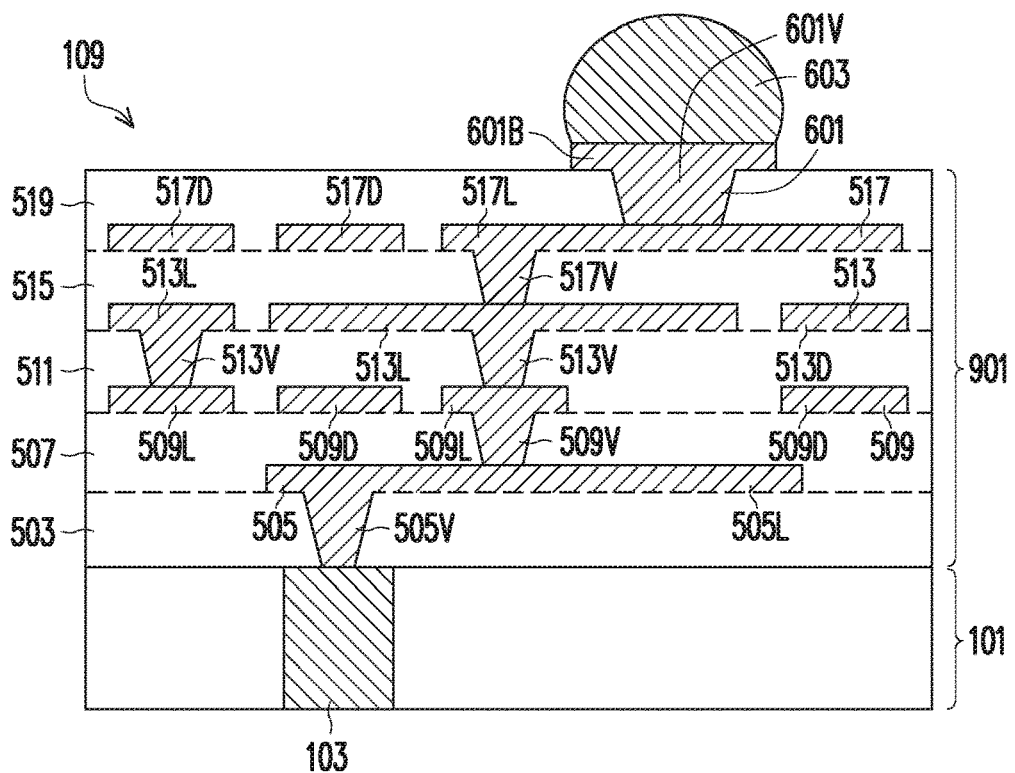

FIG. 10 illustrates a cross-sectional view of a portion 109 of the semiconductor device 100 (see FIG. 1A) in accordance with some embodiments. The structure illustrated in FIG. 10 is similar to the structure illustrated in FIG. 9, with similar features being labeled by similar numerical references, and descriptions of the similar features are not repeated herein. In the illustrated embodiment, after forming the redistribution structure 901, UBMs 601 and connectors 603 are formed over the redistribution structure 901 as described above with reference to FIG. 6, and the description is not repeated herein.

Figure 11:
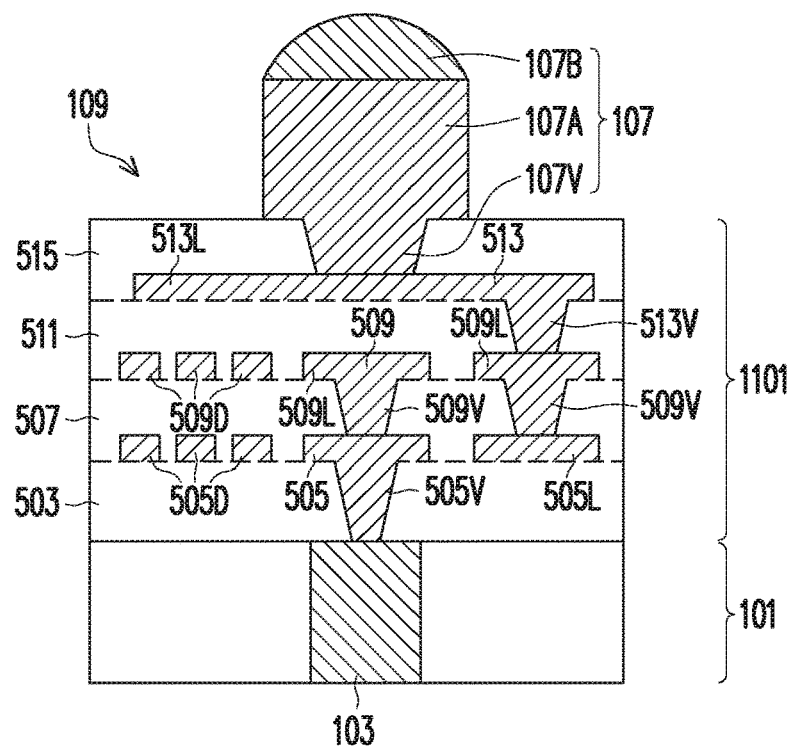

FIG. 11 illustrates a cross-sectional view of a portion 109 of the semiconductor device 100 (see FIG. 1A) in accordance with some embodiments. In the illustrated embodiment, a redistribution structure 1101 is implemented as the redistribution structure 105 of the semiconductor device 100 (see FIG. 1A). The redistribution structure 1101 includes insulating layers 503, 507, 511, and 515; and metallization patterns 505, 509, and 513. The structure of FIG. 11 is similar to the structure of FIG. 5, with similar features being labeled with similar numerical references, and descriptions of the similar features are not repeated herein. In some embodiments, the redistribution structure 1101 may be formed in a similar manner as the redistribution structure 501 described above with reference to FIG. 5, and the description is not repeated herein. In some embodiments, the redistribution structure 1101 comprises dummy conductive lines or traces 505D and 509D.

In the illustrated embodiment, the connector 103 is vertically aligned with respect to the via portion 107V of the connector 107 and is located directly below the via portion 107V of the connector 107. The vias 505V and 509V are vertically stacked over the connector 103, such that the via 505V is over and fully lands on the connector 103. The vias 509V and 513V are stacked and are laterally shifted with respect to the stacked pair of vias 505V and 509V and with respect to the via portion 107V of the connector 107. By stacking and staggering the vias 505V, 509V, and 513V in the redistribution structure 1101 as described above, a strain within the redistribution structure 1101 is reduced. Accordingly, generation of defects in the redistribution structure 1101 due to the strain is reduced or eliminated, which improves flexibility of circuit design for the redistribution structure, routing efficiency of the redistribution structure, and the reliability of a semiconductor device comprising the redistribution structure 1101.

Figure 12:
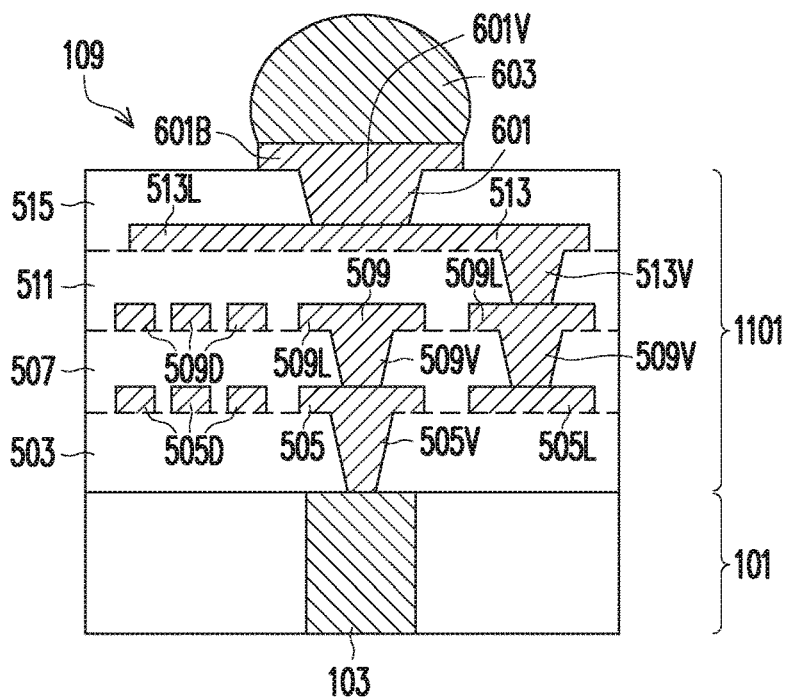

FIG. 12 illustrates a cross-sectional view of a portion 109 of the semiconductor device 100 (see FIG. 1A) in accordance with some embodiments. The structure illustrated in FIG. 12 is similar to the structure illustrated in FIG. 11, with similar features being labeled by similar numerical references, and descriptions of the similar features are not repeated herein. In the illustrated embodiment, after forming the redistribution structure 1101, UBMs 601 and connectors 603 are formed over the redistribution structure 1101 as described above with reference to FIG. 6, and the description is not repeated herein.

Figure 13:
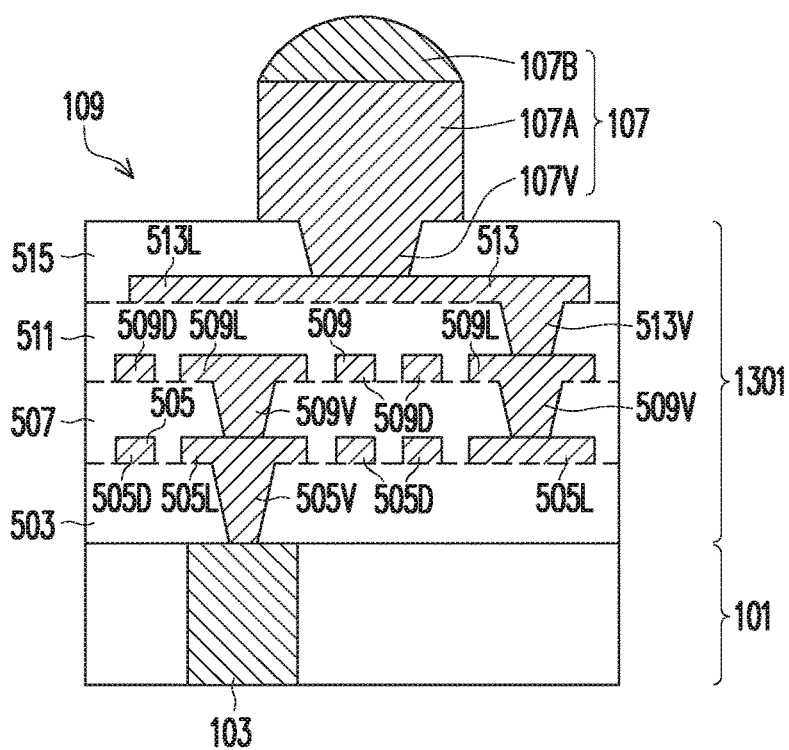

FIG. 13 illustrates a cross-sectional view of a portion 109 of the semiconductor device 100 (see FIG. 1A) in accordance with some embodiments. In the illustrated embodiment, a redistribution structure 1301 is implemented as the redistribution structure 105 of the semiconductor device 100 (see FIG. 1A). The redistribution structure 1301 includes insulating layers 503, 507, 511, and 515; and metallization patterns 505, 509, and 513. The structure of FIG. 13 is similar to the structure of FIG. 11, with similar features being labeled with similar numerical references, and descriptions of the similar features are not repeated herein. In some embodiments, the redistribution structure 1301 may be formed in a similar manner as the redistribution structure 501 described above with reference to FIG. 5, and the description is not repeated herein.

In the illustrated embodiment, the redistribution structure 1301 is similar to the redistribution structure 1101 (see FIG. 11) with the distinction that the connector 103 with overlaying pair of stacked vias 505V and 509V is laterally shifted with respect to the via portion 107V of the connector 107. By stacking and staggering the vias 505V, 509V, and 513V in the redistribution structure 1301 as described above, a strain within the redistribution structure 1301 is reduced. Accordingly, generation of defects in the redistribution structure 1301 due to the strain is reduced or eliminated, which improves flexibility of circuit design for the redistribution structure, routing efficiency of the redistribution structure, and the reliability of a semiconductor device comprising the redistribution structure 1301.

Figure 14:
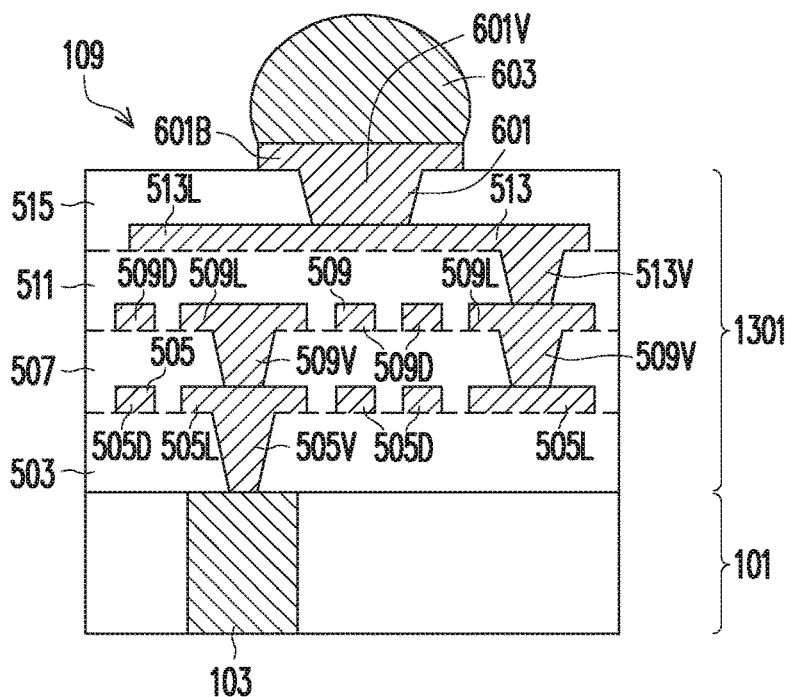

FIG. 14 illustrates a cross-sectional view of a portion 109 of the semiconductor device 100 (see FIG. 1A) in accordance with some embodiments. The structure illustrated in FIG. 14 is similar to the structure illustrated in FIG. 13, with similar features being labeled by similar numerical references, and descriptions of the similar features are not repeated herein. In the illustrated embodiment, after forming the redistribution structure 1301, UBMs 601 and connectors 603 are formed over the redistribution structure 1301 as described above with reference to FIG. 6, and the description is not repeated herein.

Figure 15:
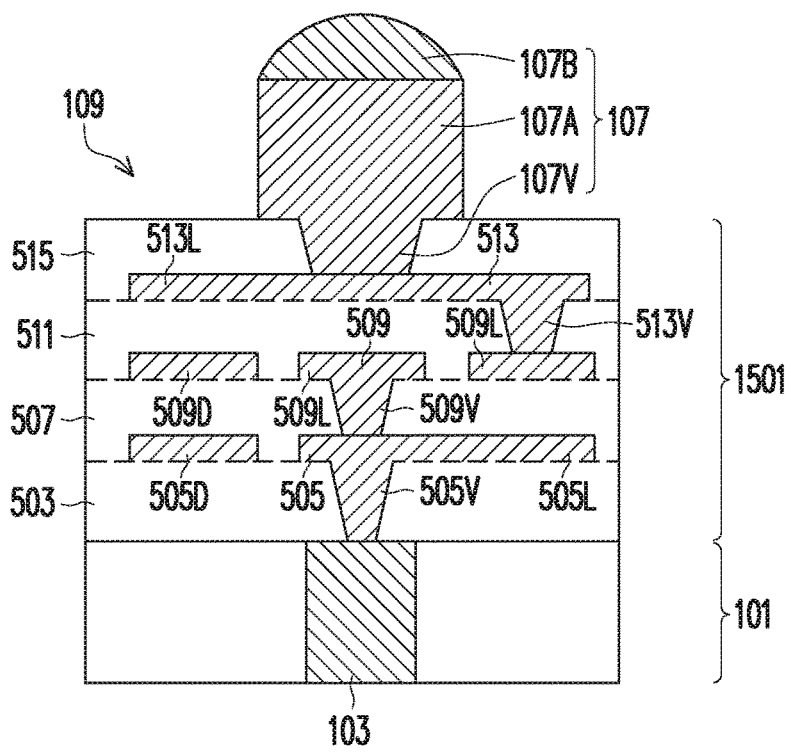

FIG. 15 illustrates a cross-sectional view of a portion 109 of the semiconductor device 100 (see FIG. 1A) in accordance with some embodiments. In the illustrated embodiment, a redistribution structure 1501 is implemented as the redistribution structure 105 of the semiconductor device 100 (see FIG. 1A). The redistribution structure 1501 includes insulating layers 503, 507, 511, and 515; and metallization patterns 505, 509, and 513. The structure of FIG. 15 is similar to the structure of FIG. 5, with similar features being labeled with similar numerical references, and descriptions of the similar features are not repeated herein. In some embodiments, the redistribution structure 1501 may be formed in a similar manner as the redistribution structure 501 described above with reference to FIG. 5, and the description is not repeated herein. In some embodiments, the redistribution structure 1501 comprises dummy conductive lines or traces 505D and 509D.

In the illustrated embodiment, the connector 103 is vertically aligned with respect to the via portion 107V of the connector 107 and is located directly below the via portion 107V of the connector 107. The vias 505V and 509V are vertically stacked such that the via 505V is over and fully lands on the connector 103. The via 513V is laterally shifted with respect to the stacked pair of vias 505V and 509V, and with respect to the via portion 107V of the connector 107. By stacking and staggering the vias 505V, 509V, and 513V in the redistribution structure 1501 as described above, a strain within the redistribution structure 1501 is reduced. Accordingly, generation of defects in the redistribution structure 1501 due to the strain is reduced or eliminated, which improves flexibility of circuit design for the redistribution structure, routing efficiency of the redistribution structure, and the reliability of a semiconductor device comprising the redistribution structure 1501.

Figure 16:
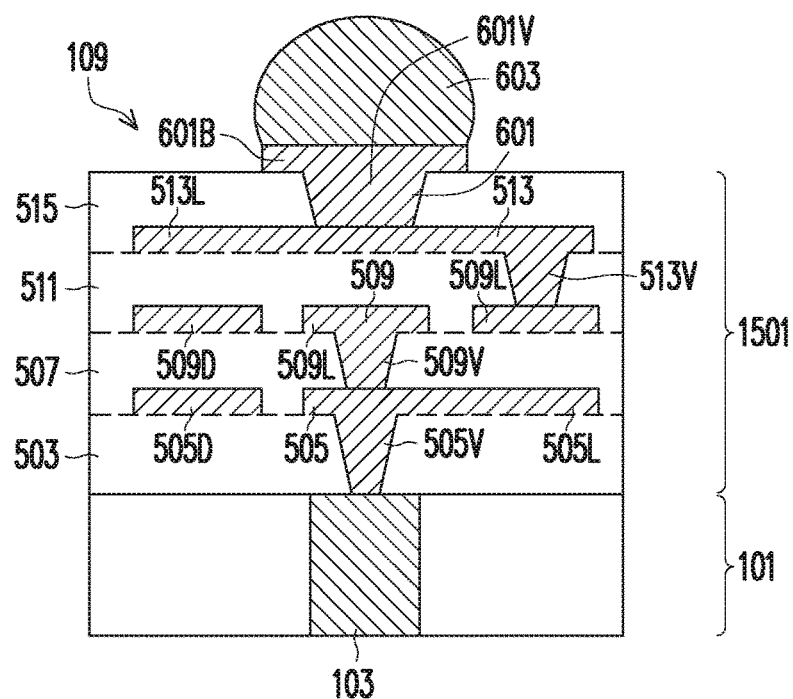

FIG. 16 illustrates a cross-sectional view of a portion 109 of the semiconductor device 100 (see FIG. 1A) in accordance with some embodiments. The structure illustrated in FIG. 16 is similar to the structure illustrated in FIG. 15, with similar features being labeled by similar numerical references, and descriptions of the similar features are not repeated herein. In the illustrated embodiment, after forming the redistribution structure 1501, UBMs 601 and connectors 603 are formed over the redistribution structure 1501 as described above with reference to FIG. 6, and the description is not repeated herein.

Figure 17:
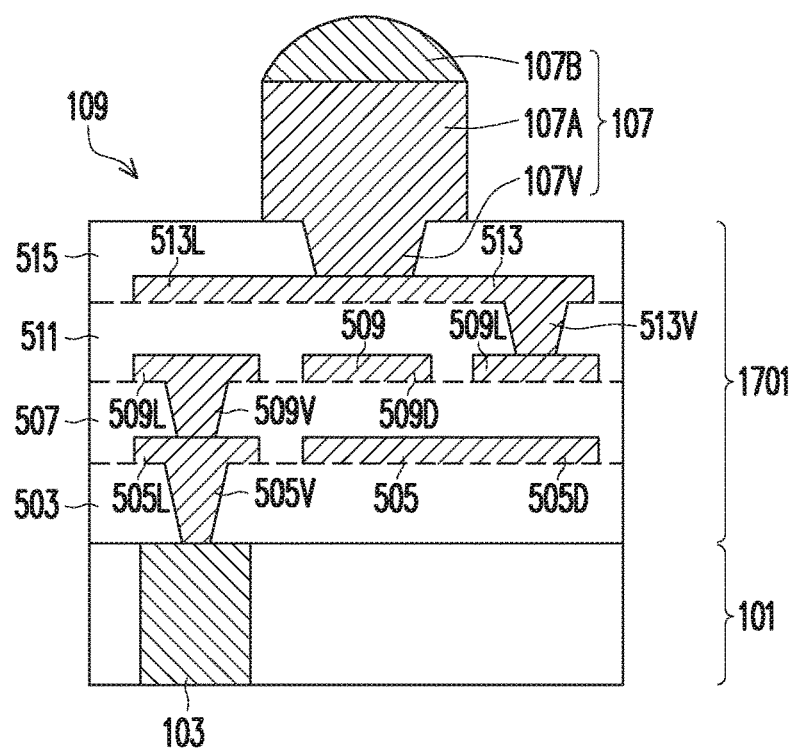

FIG. 17 illustrates a cross-sectional view of a portion 109 of the semiconductor device 100 (see FIG. 1A) in accordance with some embodiments. In the illustrated embodiment, a redistribution structure 1701 is implemented as the redistribution structure 105 of the semiconductor device 100 (see FIG. 1A). The redistribution structure 1701 includes insulating layers 503, 507, 511, and 515; and metallization patterns 505, 509, and 513. The structure of FIG. 17 is similar to the structure of FIG. 15, with similar features being labeled with similar numerical references, and descriptions of the similar features are not repeated herein. In some embodiments, the redistribution structure 1701 may be formed in a similar manner as the redistribution structure 501 described above with reference to FIG. 5, and the description is not repeated herein.

In the illustrated embodiment, the redistribution structure 1701 is similar to the redistribution structure 1501 (see FIG. 15) with the distinction that the connector 103 with overlaying pair of stacked vias 505V and 509V are laterally shifted with respect to the via portion 107V of the connector 107. By stacking and staggering the vias 505V, 509V, and 513V in the redistribution structure 1701 as described above, a strain within the redistribution structure 1701 is reduced. Accordingly, generation of defects in the redistribution structure 1701 due to the strain is reduced or eliminated, which improves flexibility of circuit design for the redistribution structure, routing efficiency of the redistribution structure, and the reliability of a semiconductor device comprising the redistribution structure 1701.

Figure 18:
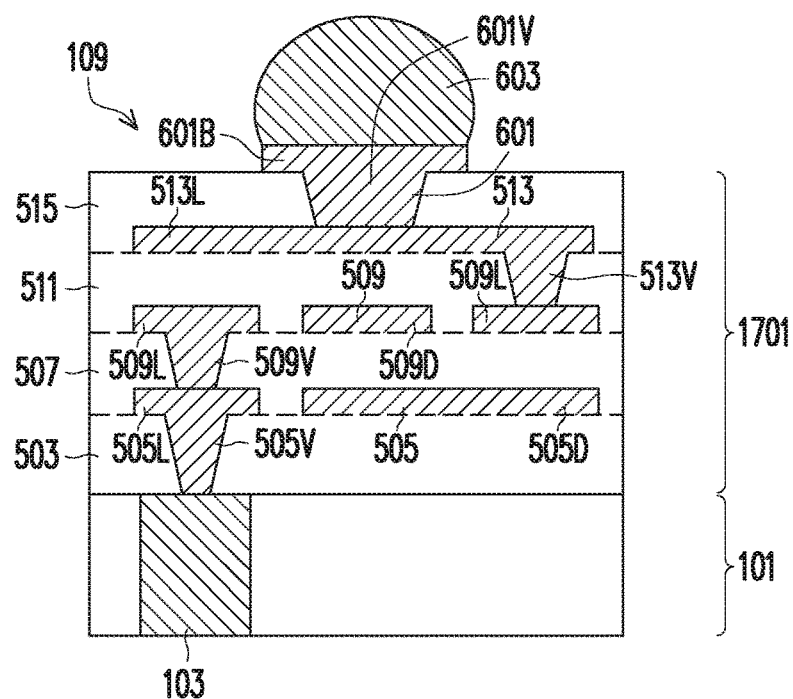

FIG. 18 illustrates a cross-sectional view of a portion 109 of the semiconductor device 100 (see FIG. 1A) in accordance with some embodiments. The structure illustrated in FIG. 18 is similar to the structure illustrated in FIG. 17, with similar features being labeled by similar numerical references, and descriptions of the similar features are not repeated herein. In the illustrated embodiment, after forming the redistribution structure 1701, UBMs 601 and connectors 603 are formed over the redistribution structure 1701 as described above with reference to FIG. 6, and the description is not repeated herein.

Figure 19:
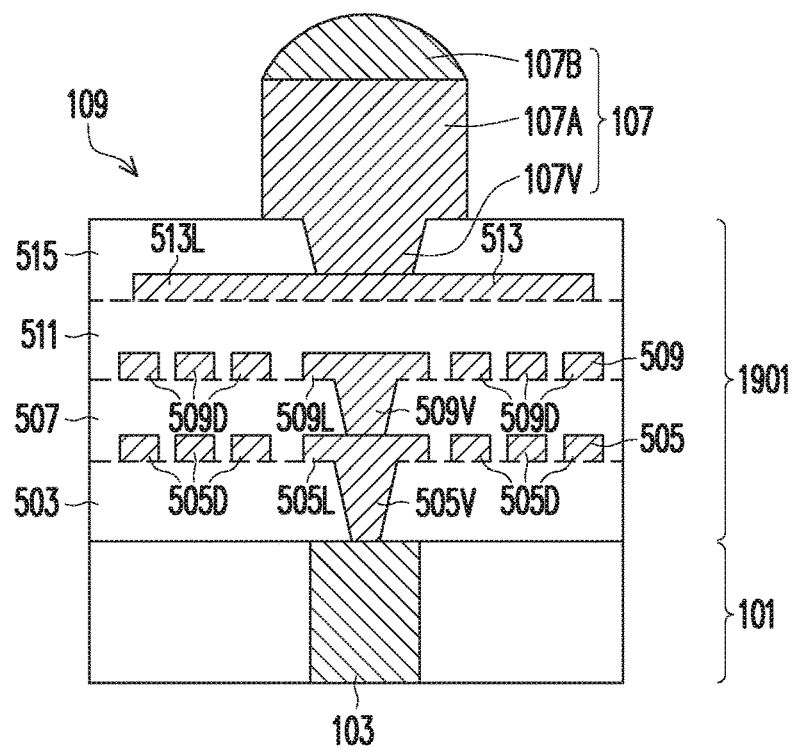

FIG. 19 illustrates a cross-sectional view of a portion 109 of the semiconductor device 100 (see FIG. 1A) in accordance with some embodiments. In the illustrated embodiment, a redistribution structure 1901 is implemented as the redistribution structure 105 of the semiconductor device 100 (see FIG. 1A). The redistribution structure 1901 includes insulating layers 503, 507, 511, and 515; and metallization patterns 505, 509, and 513. The structure of FIG. 19 is similar to the structure of FIG. 5, with similar features being labeled with similar numerical references, and descriptions of the similar features are not repeated herein. In some embodiments, the redistribution structure 1901 may be formed in a similar manner as the redistribution structure 501 described above with reference to FIG. 5, and the description is not repeated herein. In some embodiments, the redistribution structure 1901 comprises dummy conductive lines or traces 505D and 509D.

In the illustrated embodiment, the connector 103 is vertically aligned with respect to the via portion 107V of the connector 107 and is located directly below the via portion 107V of the connector 107. The vias 505V and 509V are vertically stacked such that the via 505V is over and fully lands on the connector 103. In some embodiment, the metallization pattern 513 of the redistribution structure 1901 does not comprise vias. By stacking the vias 505V and 509V in the redistribution structure 1901 as described above, a strain within the redistribution structure 1901 is reduced. Accordingly, generation of defects in the redistribution structure 1901 due to the strain is reduced or eliminated, which improves flexibility of circuit design for the redistribution structure, routing efficiency of the redistribution structure, and the reliability of a semiconductor device comprising the redistribution structure 1901.

Figure 20:
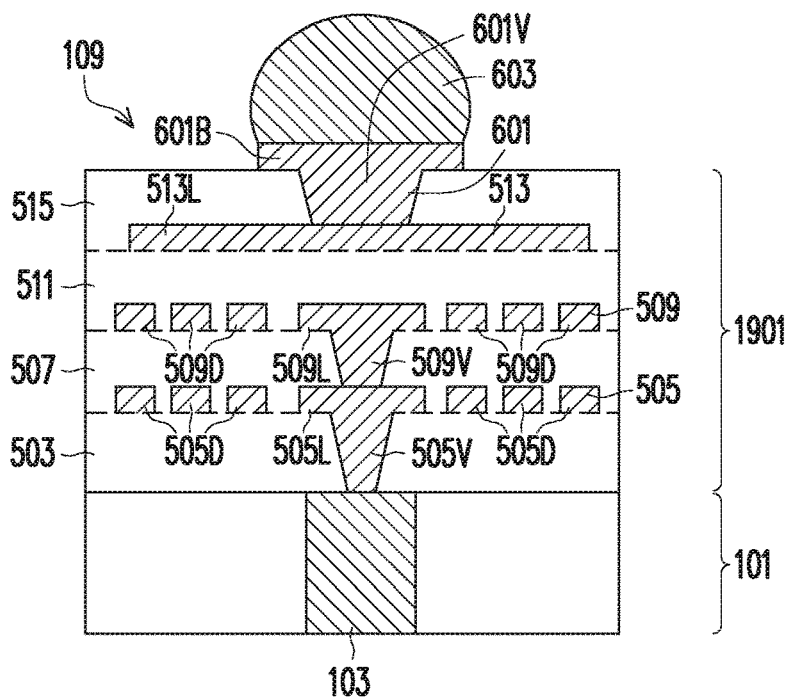

FIG. 20 illustrates a cross-sectional view of a portion 109 of the semiconductor device 100 (see FIG. 1A) in accordance with some embodiments. The structure illustrated in FIG. 20 is similar to the structure illustrated in FIG. 19, with similar features being labeled by similar numerical references, and descriptions of the similar features are not repeated herein. In the illustrated embodiment, after forming the redistribution structure 1901, UBMs 601 and connectors 603 are formed over the redistribution structure 1901 as described above with reference to FIG. 6, and the description is not repeated herein.

Figure 21:
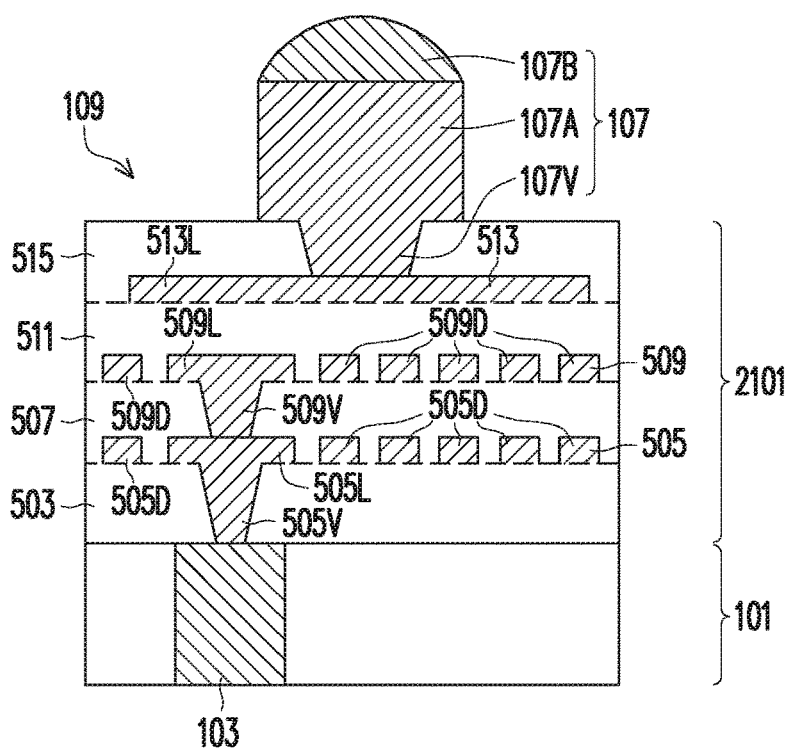

FIG. 21 illustrates a cross-sectional view of a portion 109 of the semiconductor device 100 (see FIG. 1A) in accordance with some embodiments. In the illustrated embodiment, a redistribution structure 2101 is implemented as the redistribution structure 105 of the semiconductor device 100 (see FIG. 1A). The redistribution structure 2101 includes insulating layers 503, 507, 511, and 515; and metallization patterns 505, 509, and 513. The structure of FIG. 21 is similar to the structure of FIG. 19, with similar features being labeled with similar numerical references, and descriptions of the similar features are not repeated herein. In some embodiments, the redistribution structure 2101 may be formed in a similar manner as the redistribution structure 501 described above with reference to FIG. 5, and the description is not repeated herein. In some embodiments, the redistribution structure 2101 comprises dummy conductive lines or traces 505D and 509D.

In the illustrated embodiment, the redistribution structure 2101 is similar to the redistribution structure 1901 (see FIG. 19) with the distinction that the connector 103 with overlaying pair of stacked vias 505V and 509V are laterally shifted with respect to the via portion 107V of the connector 107. By stacking and staggering the vias 505V and 509V in the redistribution structure 2101 as described above, a strain within the redistribution structure 2101 is reduced. Accordingly, generation of defects in the redistribution structure 2101 due to the strain is reduced or eliminated, which improves flexibility of circuit design for the redistribution structure, routing efficiency of the redistribution structure, and the reliability of a semiconductor device comprising the redistribution structure 2101.

Figure 22:
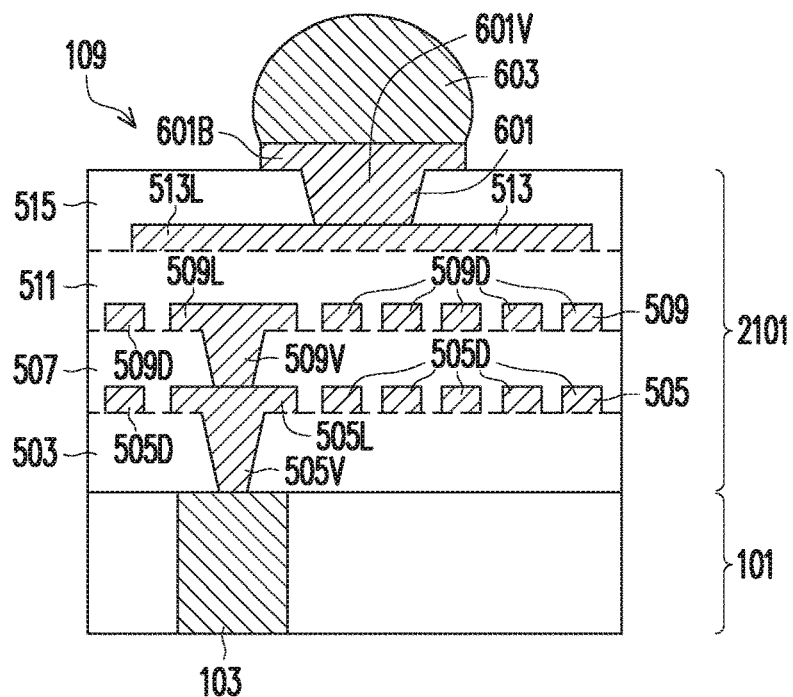

FIG. 22 illustrates a cross-sectional view of a portion 109 of the semiconductor device 100 (see FIG. 1A) in accordance with some embodiments. The structure illustrated in FIG. 22 is similar to the structure illustrated in FIG. 21, with similar features being labeled by similar numerical references, and descriptions of the similar features are not repeated herein. In the illustrated embodiment, after forming the redistribution structure 2101, UBMs 601 and connectors 603 are formed over the redistribution structure 2101 as described above with reference to FIG. 6, and the description is not repeated herein.

Figure 23:
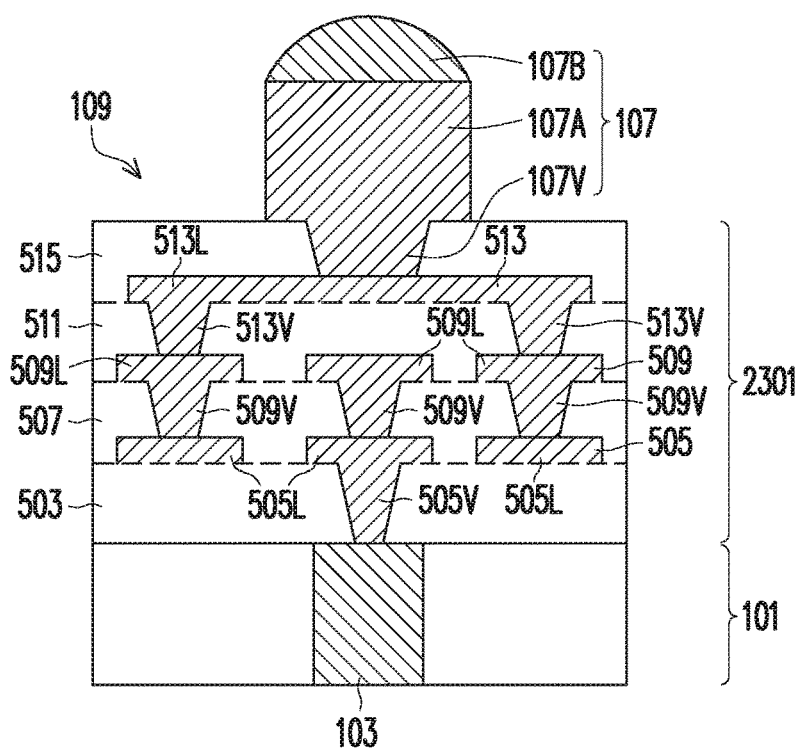

FIG. 23 illustrates a cross-sectional view of a portion 109 of the semiconductor device 100 (see FIG. 1A) in accordance with some embodiments. In the illustrated embodiment, a redistribution structure 2301 is implemented as the redistribution structure 105 of the semiconductor device 100

(see FIG. 1A). The redistribution structure 2301 includes insulating layers 503, 507, 511, and 515; and metallization patterns 505, 509, and 513. The structure of FIG. 23 is similar to the structure of FIG. 5, with similar features being labeled with similar numerical references, and descriptions of the similar features are not repeated herein. In some embodiments, the redistribution structure 2301 may be formed in a similar manner as the redistribution structure 501 described above with reference to FIG. 5, and the description is not repeated herein. In the illustrated embodiment, the redistribution structure 2301 does not comprise dummy conductive lines or traces.

In the illustrated embodiment, the connector 103 is vertically aligned with respect to the via portion 107V of the connector 107 and is located directly below the via portion 107V of the connector 107. The vias 505V and 509V are vertically stacked over the connector 103, such that the via 505V is over and fully lands on the connector 103. Stacked pairs of vias 509V and 513V are laterally shifted with respect to the stacked pair of vias 505V and 509V, and with respect to the via portion 107V of the connector 107. By stacking and staggering the vias 505V, 509V, and 513V in the redistribution structure 2301 as described above, a strain within the redistribution structure 2301 is reduced. Accordingly, generation of defects in the redistribution structure 2301 due to the strain is reduced or eliminated, which improves flexibility of circuit design for the redistribution structure, routing efficiency of the redistribution structure, and the reliability of a semiconductor device comprising the redistribution structure 2301.

Figure 24:
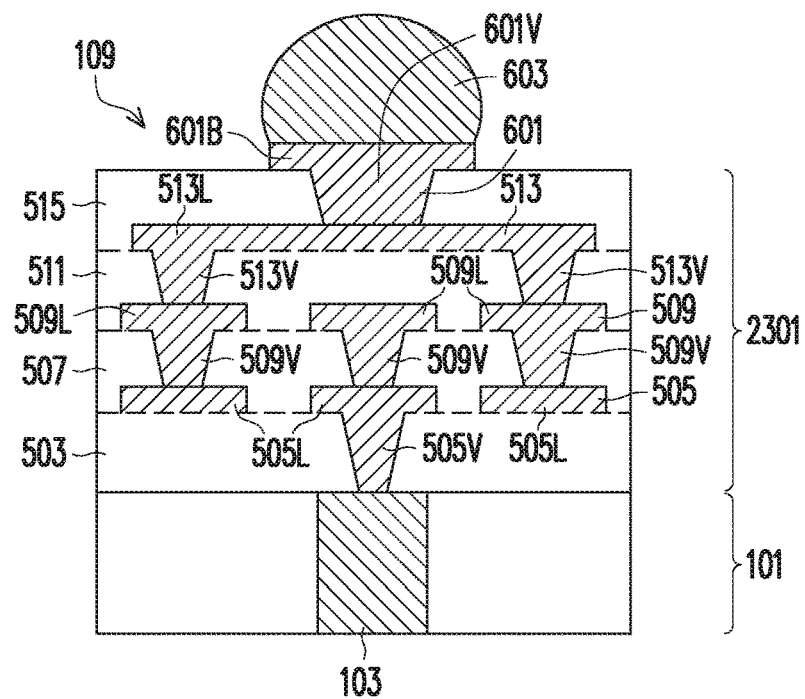

FIG. 24 illustrates a cross-sectional view of a portion 109 of the semiconductor device 100 (see FIG. 1A) in accordance with some embodiments. The structure illustrated in FIG. 24 is similar to the structure illustrated in FIG. 23, with similar features being labeled by similar numerical references, and descriptions of the similar features are not repeated herein. In the illustrated embodiment, after forming the redistribution structure 2301, UBMs 601 and connectors 603 are formed over the redistribution structure 2301 as described above with reference to FIG. 6, and the description is not repeated herein.

Figure 25:
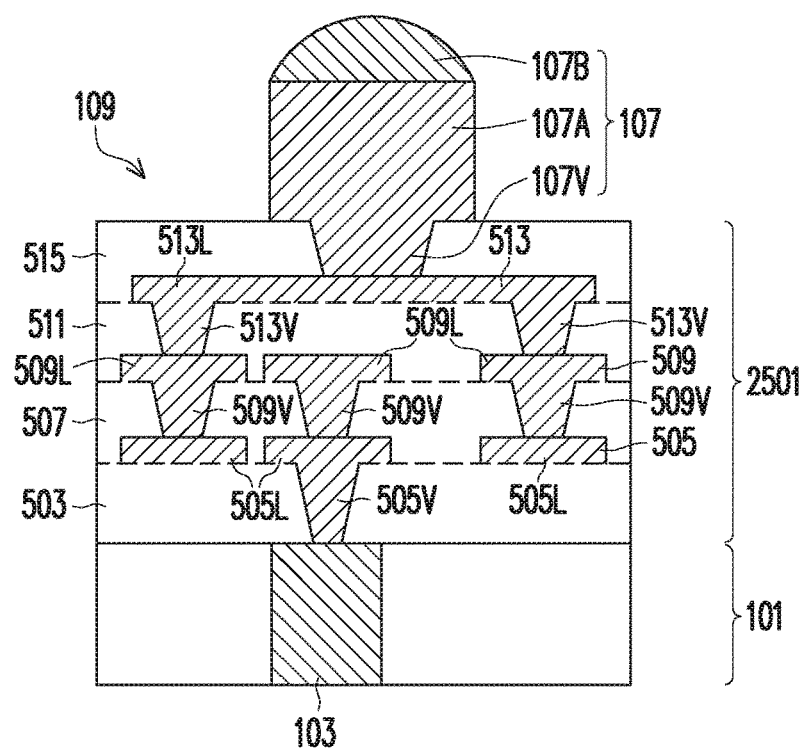

FIG. 25 illustrates a cross-sectional view of a portion 109 of the semiconductor device 100 (see FIG. 1A) in accordance with some embodiments. In the illustrated embodiment, a redistribution structure 2501 is implemented as the redistribution structure 105 of the semiconductor device 100 (see FIG. 1A). The redistribution structure 2501 includes insulating layers 503, 507, 511, and 515; and metallization patterns 505, 509, and 513. The structure of FIG. 25 is similar to the structure of FIG. 23, with similar features being labeled with similar numerical references, and descriptions of the similar features are not repeated herein. In some embodiments, the redistribution structure 2501 may be formed in a similar manner as the redistribution structure 501 described above with reference to FIG. 5, and the description is not repeated herein. In the illustrated embodiment, the redistribution structure 2501 does not comprise dummy conductive lines or traces.

In the illustrated embodiment, the redistribution structure 2501 is similar to the redistribution structure 2301 (see FIG. 23) with the distinction that the connector 103 with the overlaying pair of stacked vias 505V and 509V are laterally shifted with respect to the via portion 107V of the connector 107. By stacking and staggering the vias 505V, 509V, and 513V in the redistribution structure 2501 as described above, a strain within the redistribution structure 2501 is reduced. Accordingly, generation of defects in the redistribution structure 2501 due to the strain is reduced or eliminated, which improves flexibility of circuit design for the redistribution structure, routing efficiency of the redistribution structure, and the reliability of a semiconductor device comprising the redistribution structure 2501.

Figure 26:
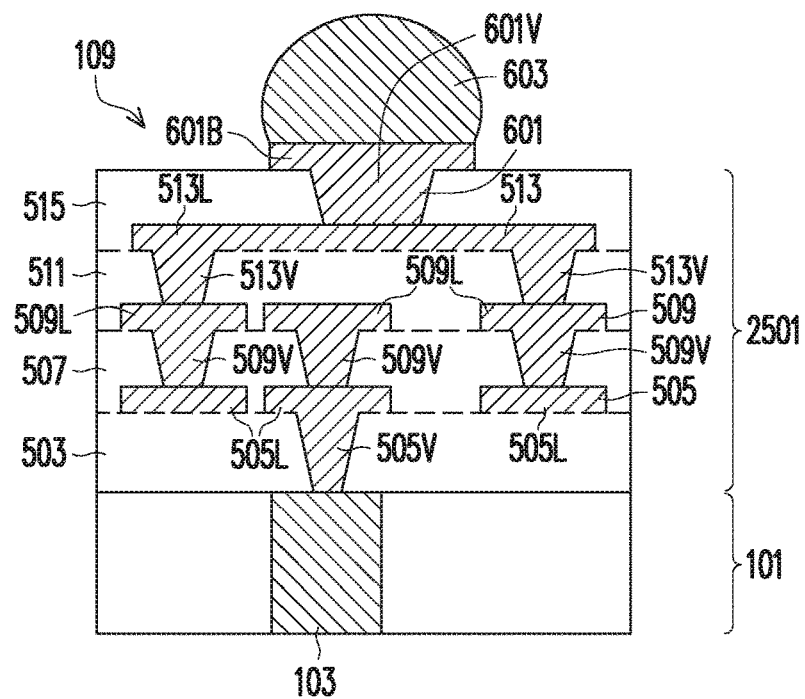

FIG. 26 illustrates a cross-sectional view of a portion 109 of the semiconductor device 100 (see FIG. 1A) in accordance with some embodiments. The structure illustrated in FIG. 26 is similar to the structure illustrated in FIG. 25, with similar features being labeled by similar numerical references, and descriptions of the similar features are not repeated herein. In the illustrated embodiment, after forming the redistribution structure 2501, UBMs 601 and connectors 603 are formed over the redistribution structure 2501 as described above with reference to FIG. 6, and the description is not repeated herein.

Figure 27:
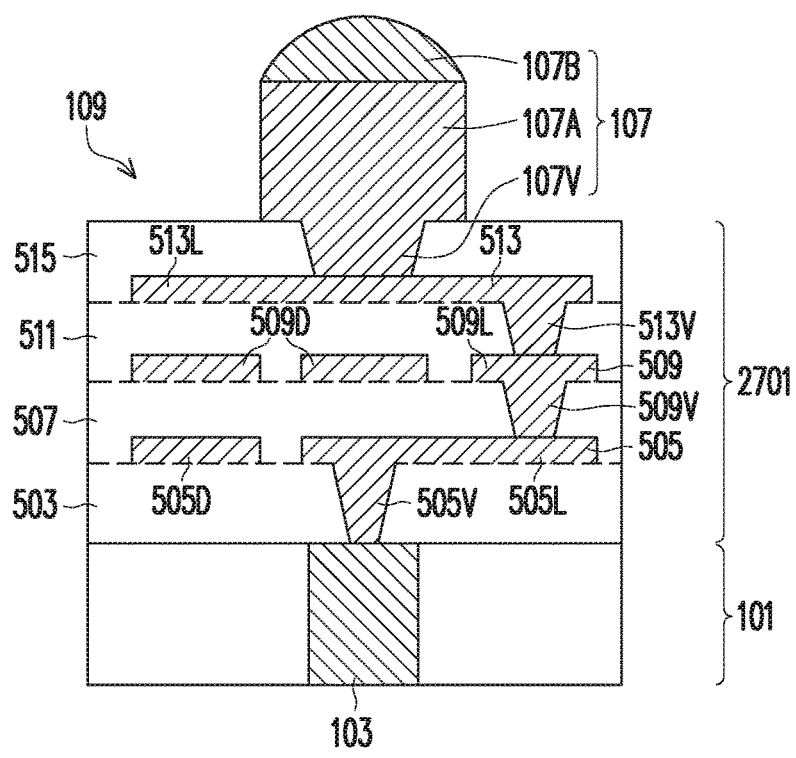

FIG. 27 illustrates a cross-sectional view of a portion 109 of the semiconductor device 100 (see FIG. 1A) in accordance with some embodiments. In the illustrated embodiment, a redistribution structure 2701 is implemented as the redistribution structure 105 of the semiconductor device 100 (see FIG. 1A). The redistribution structure 2701 includes insulating layers 503, 507, 511, and 515; and metallization patterns 505, 509, and 513. The structure of FIG. 27 is similar to the structure of FIG. 5, with similar features being labeled with similar numerical references, and descriptions of the similar features are not repeated herein. In some embodiments, the redistribution structure 2701 may be formed in a similar manner as the redistribution structure 501 described above with reference to FIG. 5, and the description is not repeated herein. In some embodiments, the redistribution structure 2701 comprises dummy conductive lines or traces 505D and 509D.

In the illustrated embodiment, the connector 103 is vertically aligned with respect to the via portion 107V of the connector 107 and is located directly below the via portion 107V of the connector 107. The via 505V is over and fully lands on the connector 103. The vias 509V and 513V are vertically stacked and are laterally shifted with respect to the via 505V and the via portion 107V of the connector 107. By stacking and staggering the vias 505V, 509V, and 513V in the redistribution structure 2701 as described above, a strain within the redistribution structure 2701 is reduced. Accordingly, generation of defects in the redistribution structure 2701 due to the strain is reduced or eliminated, which improves flexibility of circuit design for the redistribution structure, routing efficiency of the redistribution structure, and the reliability of a semiconductor device comprising the redistribution structure 2701.

Figure 28:
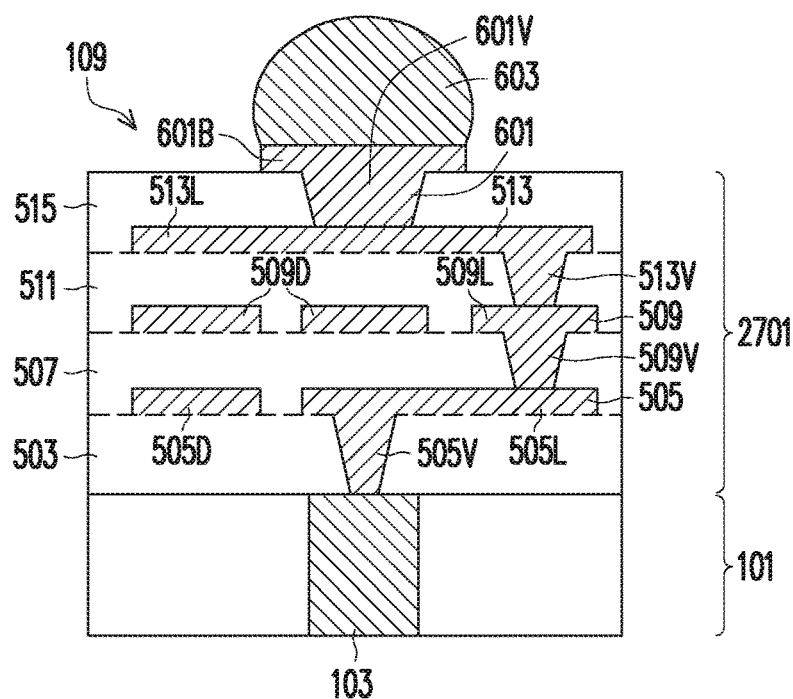

FIG. 28 illustrates a cross-sectional view of a portion 109 of the semiconductor device 100 (see FIG. 1A) in accordance with some embodiments. The structure illustrated in FIG. 28 is similar to the structure illustrated in FIG. 27, with similar features being labeled by similar numerical references, and descriptions of the similar features are not repeated herein. In the illustrated embodiment, after forming the redistribution structure 2701, UBMs 601 and connectors 603 are formed over the redistribution structure 2701 as described above with reference to FIG. 6, and the description is not repeated herein.

Figure 29:
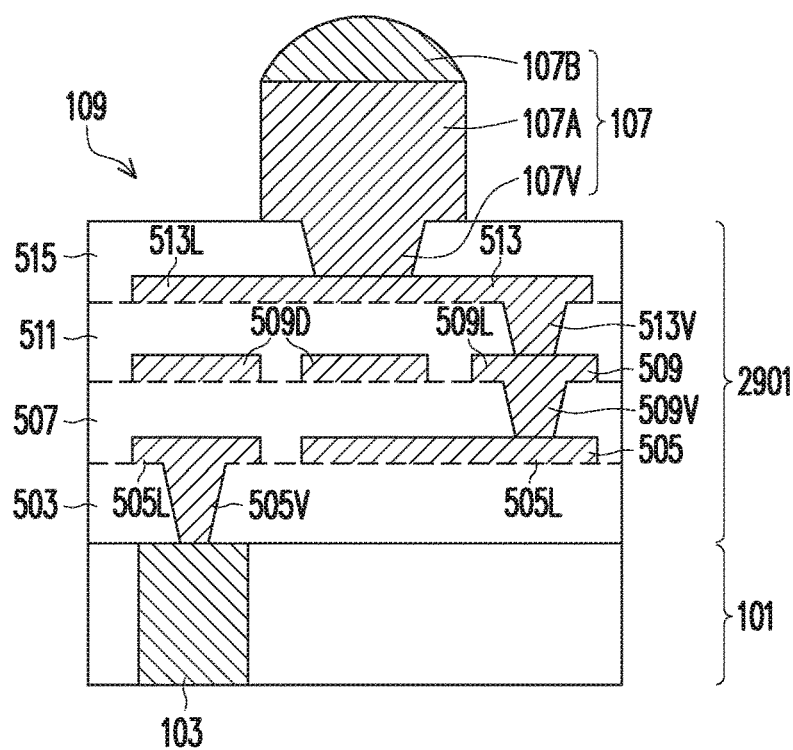

FIG. 29 illustrates a cross-sectional view of a portion 109 of the semiconductor device 100 (see FIG. 1A) in accordance with some embodiments. In the illustrated embodiment, a redistribution structure 2901 is implemented as the redistribution structure 105 of the semiconductor device 100 (see FIG. 1A). The redistribution structure 2901 includes insulating layers 503, 507, 511, and 515; and metallization patterns 505, 509, and 513. The structure of FIG. 29 is similar to the structure of FIG. 27, with similar features being labeled with similar numerical references, and descriptions of the similar features are not repeated herein. In some embodiments, the redistribution structure 2901 may be formed in a similar manner as the redistribution structure 501 described above with reference to FIG. 5, and the description is not repeated herein. In some embodiments, the redistribution structure 2901 comprises dummy conductive lines or traces 509D.

In the illustrated embodiment, the redistribution structure 2901 is similar to the redistribution structure 2701 (see FIG. 27) with the distinction that the connector 103 with the overlaying via 505V are laterally shifted with respect to the via portion 107V of the connector 107. By stacking and staggering the vias 505V, 509V, and 513V in the redistribution structure 2901 as described above, a strain within the redistribution structure 2901 is reduced. Accordingly, generation of defects in the redistribution structure 2901 due to the strain is reduced or eliminated, which improves flexibility of circuit design for the redistribution structure, routing efficiency of the redistribution structure, and the reliability of a semiconductor device comprising the redistribution structure 2901.

Figure 30:
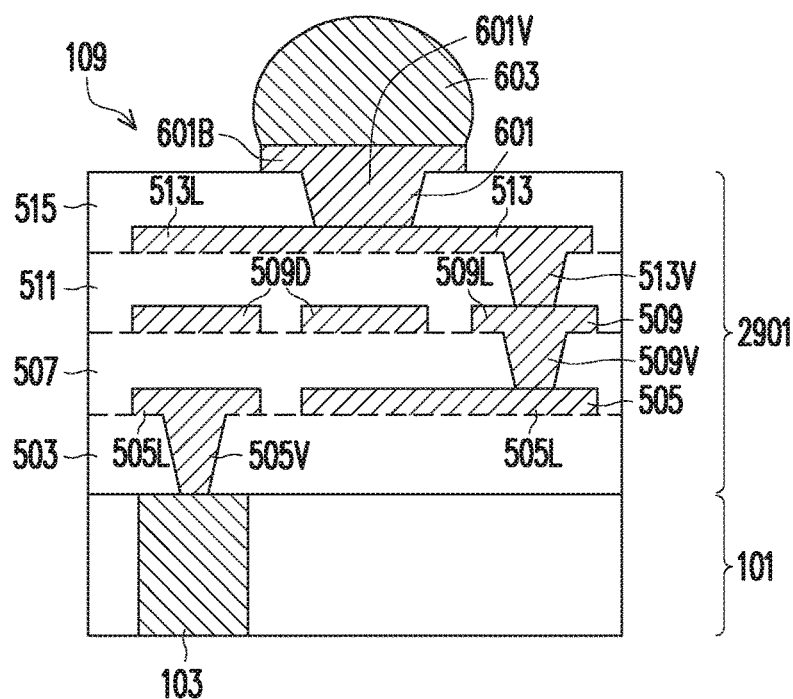

FIG. 30 illustrates a cross-sectional view of a portion 109 of the semiconductor device 100 (see FIG. 1A) in accordance with some embodiments. The structure illustrated in FIG. 30 is similar to the structure illustrated in FIG. 29, with similar features being labeled by similar numerical references, and descriptions of the similar features are not repeated herein. In the illustrated embodiment, after forming the redistribution structure 2901, UBMs 601 and connectors 603 are formed over the redistribution structure 2901 as described above with reference to FIG. 6, and the description is not repeated herein.

Figure 31:
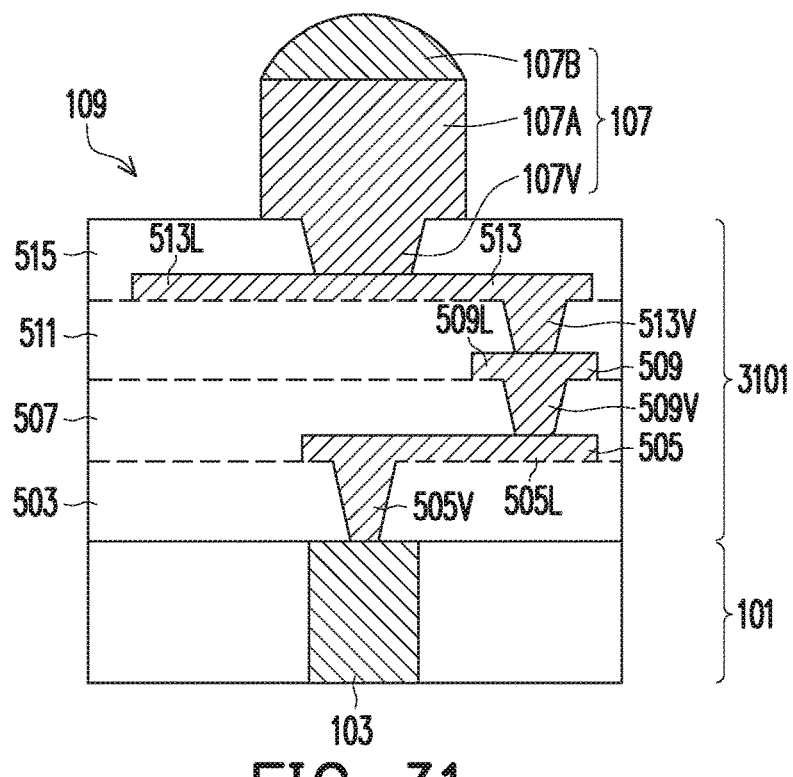

FIG. 31 illustrates a cross-sectional view of a portion 109 of the semiconductor device 100 (see FIG. 1A) in accordance with some embodiments. In the illustrated embodiment, a redistribution structure 3101 is implemented as the redistribution structure 105 of the semiconductor device 100 (see FIG. 1A). The redistribution structure 3101 includes insulating layers 503, 507, 511, and 515; and metallization patterns 505, 509, and 513. The structure of FIG. 31 is similar to the structure of FIG. 27, with similar features being labeled with similar numerical references, and descriptions of the similar features are not repeated herein. In some embodiments, the redistribution structure 3101 may be formed in a similar manner as the redistribution structure 501 described above with reference to FIG. 5, and the description is not repeated herein.

In the illustrated embodiment, the redistribution structure 3101 is similar to the redistribution structure 2701 (see FIG. 27) with the distinction that the redistribution structure 3101 does not comprise dummy conductive lines or traces (such as dummy conductive lines or traces 505D and 509D illustrated in FIG. 27). By stacking and staggering the vias 505V, 509V, and 513V in the redistribution structure 3101 as described above, a strain within the redistribution structure 3101 is reduced. Accordingly, generation of defects in the redistribution structure 3101 due to the strain is reduced or eliminated, which improves flexibility of circuit design for the redistribution structure, routing efficiency of the redistribution structure, and the reliability of a semiconductor device comprising the redistribution structure 3101.

Figure 32:
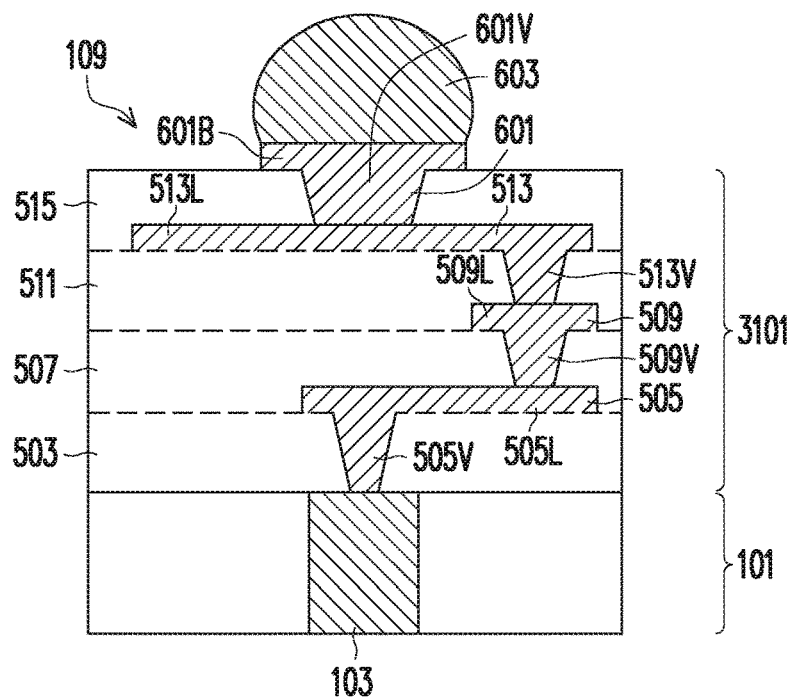

FIG. 32 illustrates a cross-sectional view of a portion 109 of the semiconductor device 100 (see FIG. 1A) in accordance with some embodiments. The structure illustrated in FIG. 32 is similar to the structure illustrated in FIG. 31, with similar features being labeled by similar numerical references, and descriptions of the similar features are not repeated herein. In the illustrated embodiment, after forming the redistribution structure 3101, UBMs 601 and connectors 603 are formed over the redistribution structure 3101 as described above with reference to FIG. 6, and the description is not repeated herein.

Figure 33:
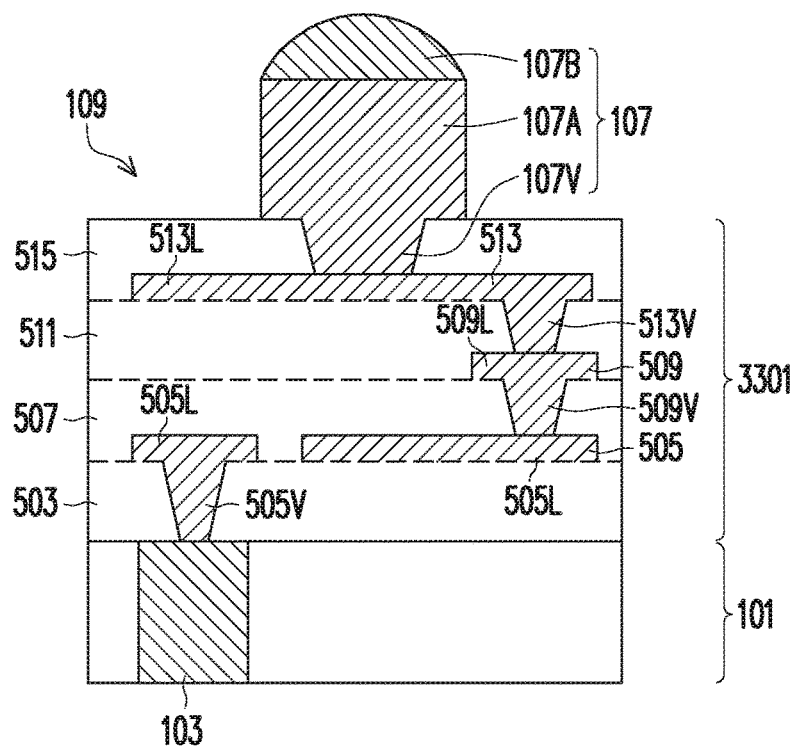

FIG. 33 illustrates a cross-sectional view of a portion 109 of the semiconductor device 100 (see FIG. 1A) in accordance with some embodiments. In the illustrated embodiment, a redistribution structure 3301 is implemented as the redistribution structure 105 of the semiconductor device 100 (see FIG. 1A). The redistribution structure 3301 includes insulating layers 503, 507, 511, and 515; and metallization patterns 505, 509, and 513. The structure of FIG. 33 is similar to the structure of FIG. 29, with similar features being labeled with similar numerical references, and descriptions of the similar features are not repeated herein. In some embodiments, the redistribution structure 3301 may be formed in a similar manner as the redistribution structure 501 described above with reference to FIG. 5, and the description is not repeated herein.

In the illustrated embodiment, the redistribution structure 3301 is similar to the redistribution structure 2901 (see FIG. 29) with the distinction that the redistribution structure 3301 does not comprise dummy conductive lines or traces (such as dummy conductive lines or traces 509D illustrated in FIG. 29). By stacking and staggering the vias 505V, 509V, and 513V in the redistribution structure 3301 as described above, a strain within the redistribution structure 3301 is reduced. Accordingly, generation of defects in the redistribution structure 3301 due to the strain is reduced or eliminated, which improves flexibility of circuit design for the redistribution structure, routing efficiency of the redistribution structure, and the reliability of a semiconductor device comprising the redistribution structure 3301.

Figure 34:
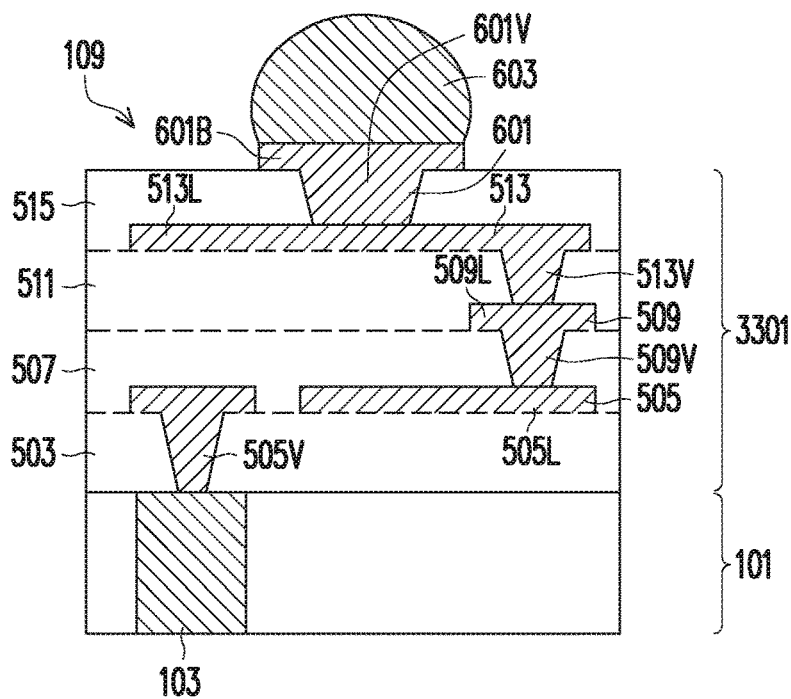

FIG. 34 illustrates a cross-sectional view of a portion 109 of the semiconductor device 100 (see FIG. 1A) in accordance with some embodiments. The structure illustrated in FIG. 34 is similar to the structure illustrated in FIG. 33, with similar features being labeled by similar numerical references, and descriptions of the similar features are not repeated herein. In the illustrated embodiment, after forming the redistribution structure 3301, UBMs 601 and connectors 603 are formed over the redistribution structure 3301 as described above with reference to FIG. 6, and the description is not repeated herein.

Figure 35:
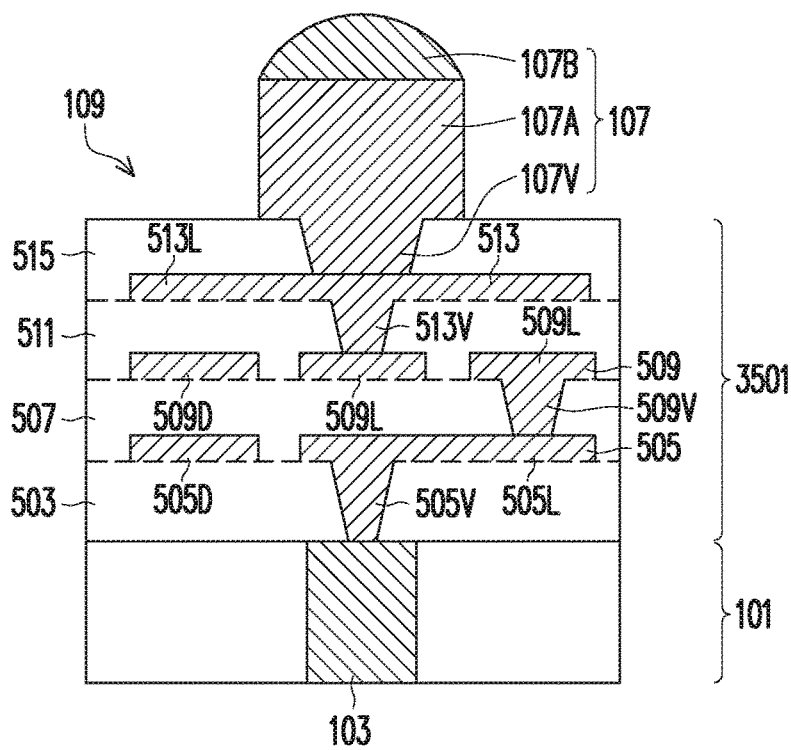

FIG. 35 illustrates a cross-sectional view of a portion 109 of the semiconductor device 100 (see FIG. 1A) in accordance with some embodiments. In the illustrated embodiment, a redistribution structure 3501 is implemented as the redistribution structure 105 of the semiconductor device 100 (see FIG. 1A). The redistribution structure 3501 includes insulating layers 503, 507, 511, and 515; and metallization patterns 505, 509, and 513. The structure of FIG. 35 is similar to the structure of FIG. 5, with similar features being labeled with similar numerical references, and descriptions of the similar features are not repeated herein. In some embodiments, the redistribution structure 3501 may be formed in a similar manner as the redistribution structure 501 described above with reference to FIG. 5, and the description is not repeated herein. In some embodiments, the redistribution structure 3501 comprises dummy conductive lines or traces 505D and 509D.

In the illustrated embodiment, the connector 103 is vertically aligned with respect to the via portion 107V of the connector 107 and is located directly below the via portion 107V of the connector 107. The via 505V is over and fully lands on the connector 103. The via 513V and the via portion 107V of the connector 107 are vertically stacked, while the via 509V is laterally shifted with respect to the vias 505V and 513V, and the via portion 107V of the connector 107. By stacking and staggering the vias 505V, 509V, and 513V in the redistribution structure 3501 as described above, a strain within the redistribution structure 3501 is reduced. Accordingly, generation of defects in the redistribution structure 3501 due to the strain is reduced or eliminated, which improves flexibility of circuit design for the redistribution structure, routing efficiency of the redistribution structure, and the reliability of a semiconductor device comprising the redistribution structure 3501.

Figure 36:
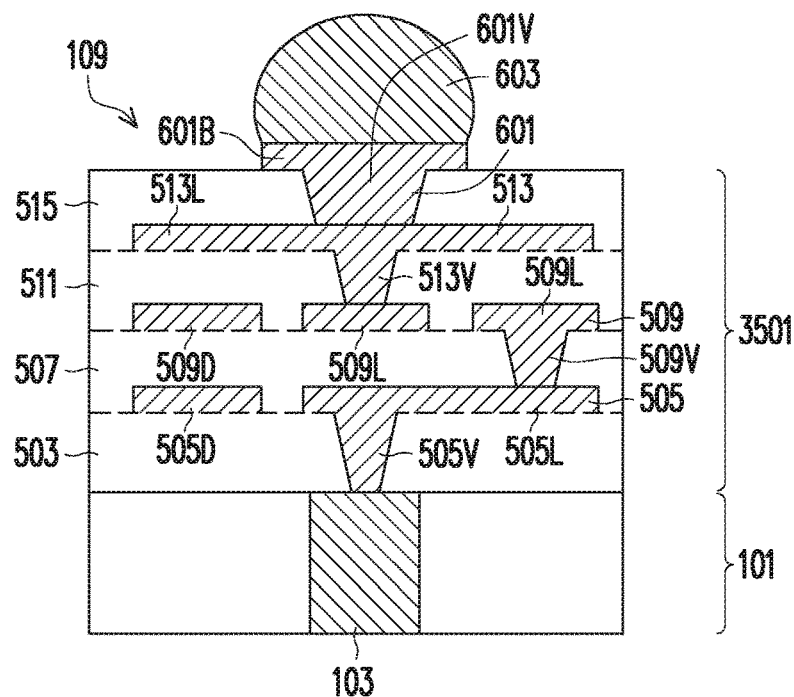

FIG. 36 illustrates a cross-sectional view of a portion 109 of the semiconductor device 100 (see FIG. 1A) in accordance with some embodiments. The structure illustrated in FIG. 36 is similar to the structure illustrated in FIG. 35, with similar features being labeled by similar numerical references, and descriptions of the similar features are not repeated herein. In the illustrated embodiment, after forming the redistribution structure 3501, UBMs 601 and connectors 603 are formed over the redistribution structure 3501 as described above with reference to FIG. 6, and the description is not repeated herein.

Figure 37:
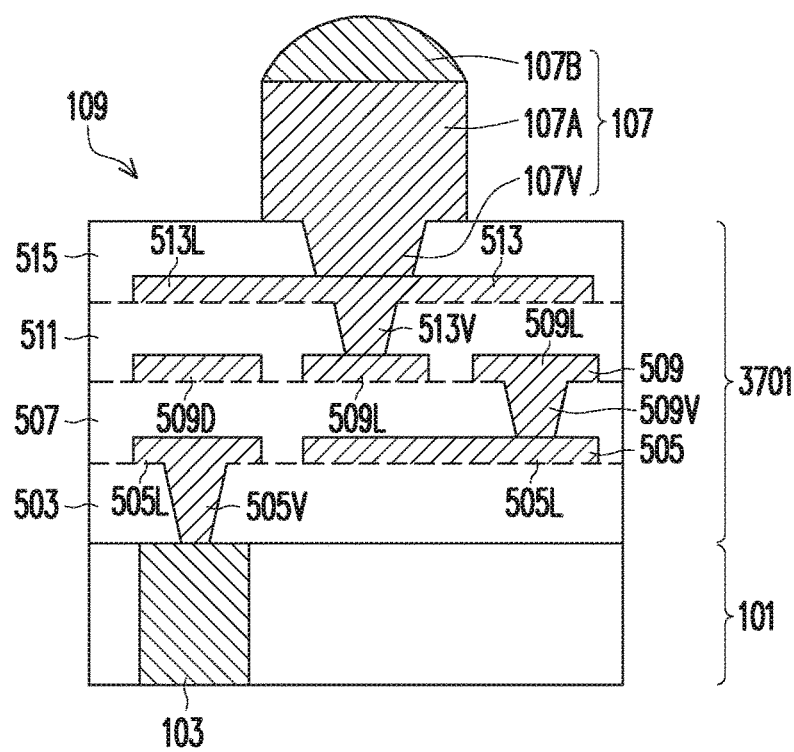

FIG. 37 illustrates a cross-sectional view of a portion 109 of the semiconductor device 100 (see FIG. 1A) in accordance with some embodiments. In the illustrated embodiment, a redistribution structure 3701 is implemented as the redistribution structure 105 of the semiconductor device 100 (see FIG. 1A). The redistribution structure 3701 includes insulating layers 503, 507, 511, and 515; and metallization patterns 505, 509, and 513. The structure of FIG. 37 is similar to the structure of FIG. 35, with similar features being labeled with similar numerical references, and descriptions of the similar features are not repeated herein. In some embodiments, the redistribution structure 3701 may be formed in a similar manner as the redistribution structure 501 described above with reference to FIG. 5, and the description is not repeated herein. In some embodiments, the redistribution structure 3501 comprises dummy conductive lines or traces 509D.

In the illustrated embodiment, the redistribution structure 3701 is similar with the redistribution structure 3501 (see FIG. 35) with the distinction that the connector 103 with the overlaying via 505V is laterally shifted with respect to the via 513V and the via portion 107V of the connector 107. By stacking and staggering the vias 505V, 509V, and 513V in the redistribution structure 3701 as described above, a strain within the redistribution structure 3701 is reduced. Accordingly, generation of defects in the redistribution structure 3701 due to the strain is reduced or eliminated, which improves flexibility of circuit design for the redistribution structure, routing efficiency of the redistribution structure, and the reliability of a semiconductor device comprising the redistribution structure 3701.

Figure 38:
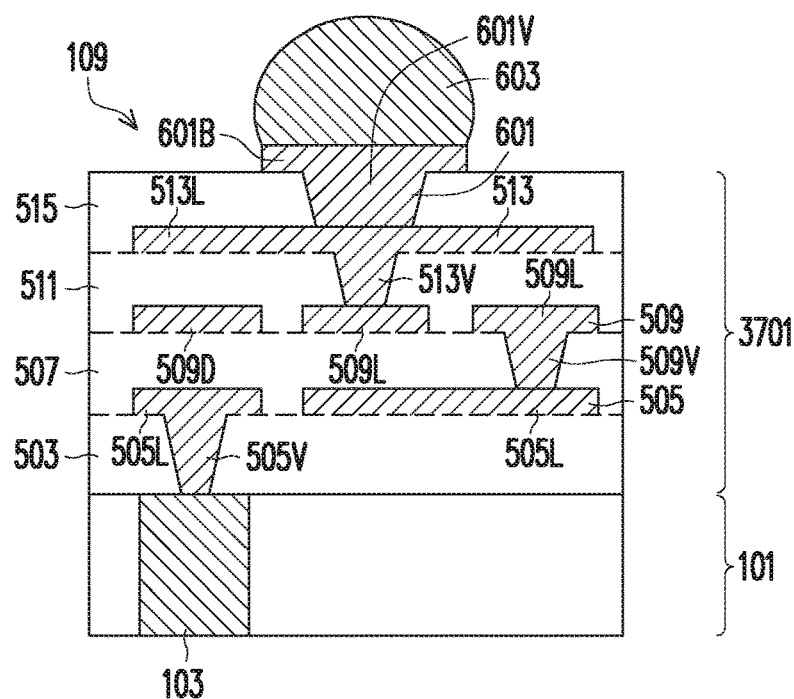

FIG. 38 illustrates a cross-sectional view of a portion 109 of the semiconductor device 100 (see FIG. 1A) in accordance with some embodiments. The structure illustrated in FIG. 38 is similar to the structure illustrated in FIG. 37, with similar features being labeled by similar numerical references, and descriptions of the similar features are not repeated herein. In the illustrated embodiment, after forming the redistribution structure 3701, UBMs 601 and connectors 603 are formed over the redistribution structure 3701 as described above with reference to FIG. 6, and the description is not repeated herein.

Figure 39:
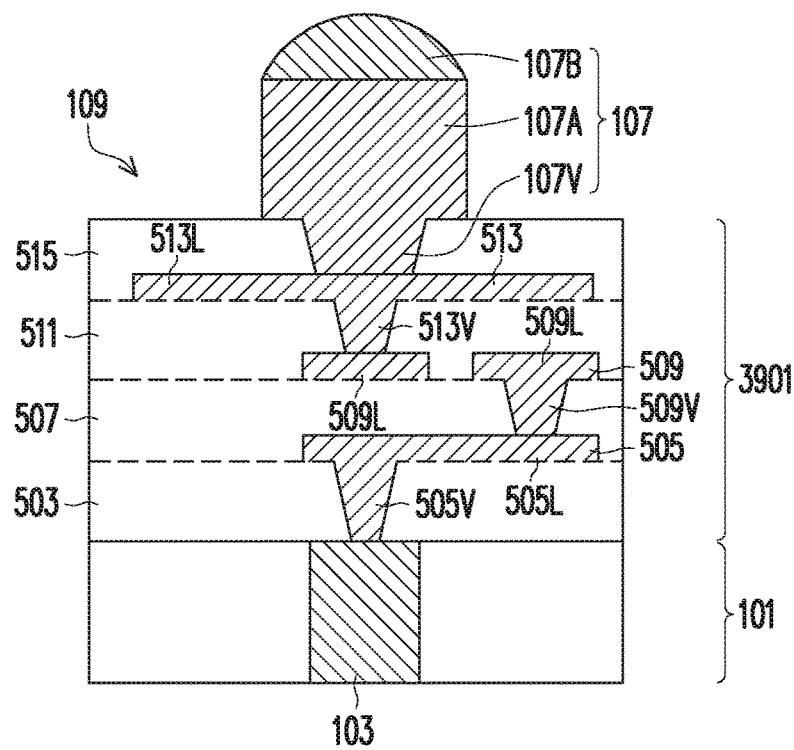

FIG. 39 illustrates a cross-sectional view of a portion 109 of the semiconductor device 100 (see FIG. 1A) in accordance with some embodiments. In the illustrated embodiment, a redistribution structure 3901 is implemented as the redistribution structure 105 of the semiconductor device 100 (see FIG. 1A). The redistribution structure 3901 includes insulating layers 503, 507, 511, and 515; and metallization patterns 505, 509, and 513. The structure of FIG. 39 is similar to the structure of FIG. 35, with similar features being labeled with similar numerical references, and descriptions of the similar features are not repeated herein. In some embodiments, the redistribution structure 3901 may be formed in a similar manner as the redistribution structure 501 described above with reference to FIG. 5, and the description is not repeated herein.

In the illustrated embodiment, the redistribution structure 3901 is similar to the redistribution structure 3501 (see FIG. 35) with the distinction that the redistribution structure 3901 does not comprise dummy conductive lines or traces (such as dummy conductive lines or traces 505D and 509D illustrated in FIG. 35). By stacking and staggering the vias 505V, 509V, and 513V in the redistribution structure 3901 as described above, a strain within the redistribution structure 3901 is reduced. Accordingly, generation of defects in the redistribution structure 3901 due to the strain is reduced or eliminated, which improves flexibility of circuit design for the redistribution structure, routing efficiency of the redistribution structure, and the reliability of a semiconductor device comprising the redistribution structure 3901.

Figure 40:
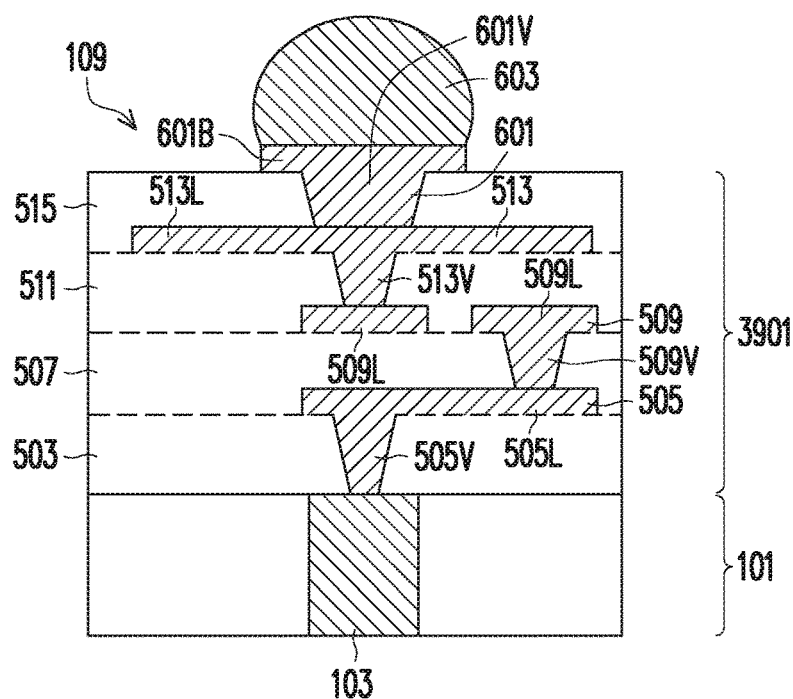

FIG. 40 illustrates a cross-sectional view of a portion 109 of the semiconductor device 100 (see FIG. 1A) in accordance with some embodiments. The structure illustrated in FIG. 40 is similar to the structure illustrated in FIG. 39, with similar features being labeled by similar numerical references, and descriptions of the similar features are not repeated herein. In the illustrated embodiment, after forming the redistribution structure 3901, UBMs 601 and connectors 603 are formed over the redistribution structure 3901 as described above with reference to FIG. 6, and the description is not repeated herein.

Figure 41:
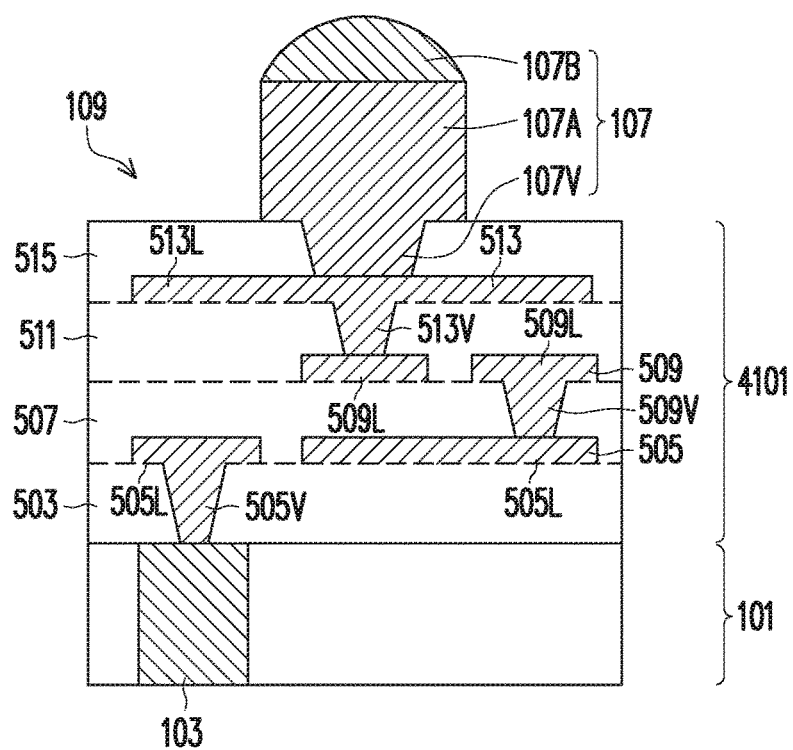

FIG. 41 illustrates a cross-sectional view of a portion 109 of the semiconductor device 100 (see FIG. 1A) in accordance with some embodiments. In the illustrated embodiment, a redistribution structure 4101 is implemented as the redistribution structure 105 of the semiconductor device 100 (see FIG. 1A). The redistribution structure 4101 includes insulating layers 503, 507, 511, and 515; and metallization patterns 505, 509, and 513. The structure of FIG. 41 is similar to the structure of FIG. 37, with similar features being labeled with similar numerical references, and descriptions of the similar features are not repeated herein. In some embodiments, the redistribution structure 4101 may be formed in a similar manner as the redistribution structure 501 described above with reference to FIG. 5, and the description is not repeated herein.

In the illustrated embodiment, the redistribution structure 4101 is similar to the redistribution structure 3701 (see FIG. 37) with the distinction that the redistribution structure 4101 does not comprise dummy conductive lines or traces (such as the dummy conductive line or trace 509D illustrated in FIG. 37). By stacking and staggering the vias 505V, 509V, and 513V in the redistribution structure 4101 as described above, a strain within the redistribution structure 4101 is reduced. Accordingly, generation of defects in the redistribution structure 4101 due to the strain is reduced or eliminated, which improves flexibility of circuit design for the redistribution structure, routing efficiency of the redistribution structure, and the reliability of a semiconductor device comprising the redistribution structure 4101.

Figure 42:
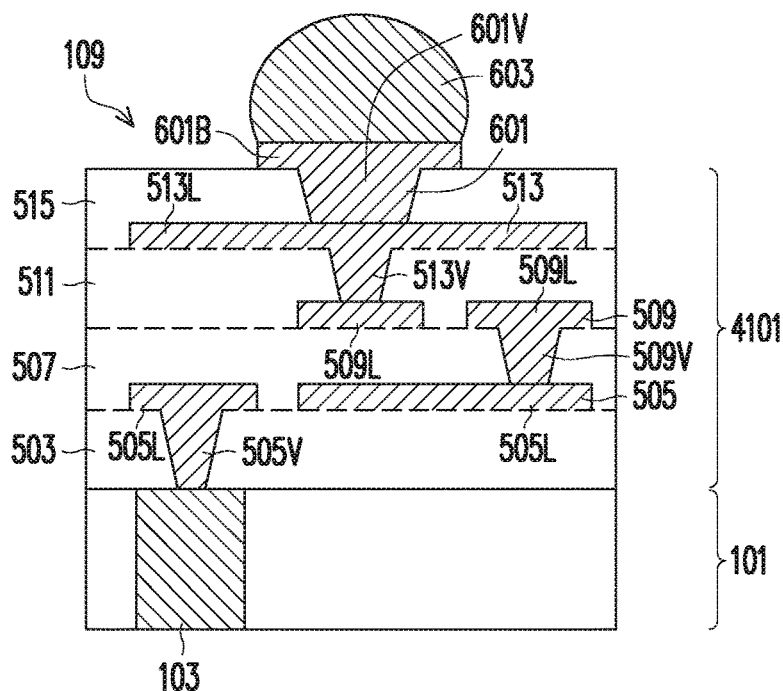

FIG. 42 illustrates a cross-sectional view of a portion 109 of the semiconductor device 100 (see FIG. 1A) in accordance with some embodiments. The structure illustrated in FIG. 42 is similar to the structure illustrated in FIG. 41, with similar features being labeled by similar numerical references, and descriptions of the similar features are not repeated herein. In the illustrated embodiment, after forming the redistribution structure 4101, UBMs 601 and connectors 603 are formed over the redistribution structure 4101 as described above with reference to FIG. 6, and the description is not repeated herein.

Figure 43:
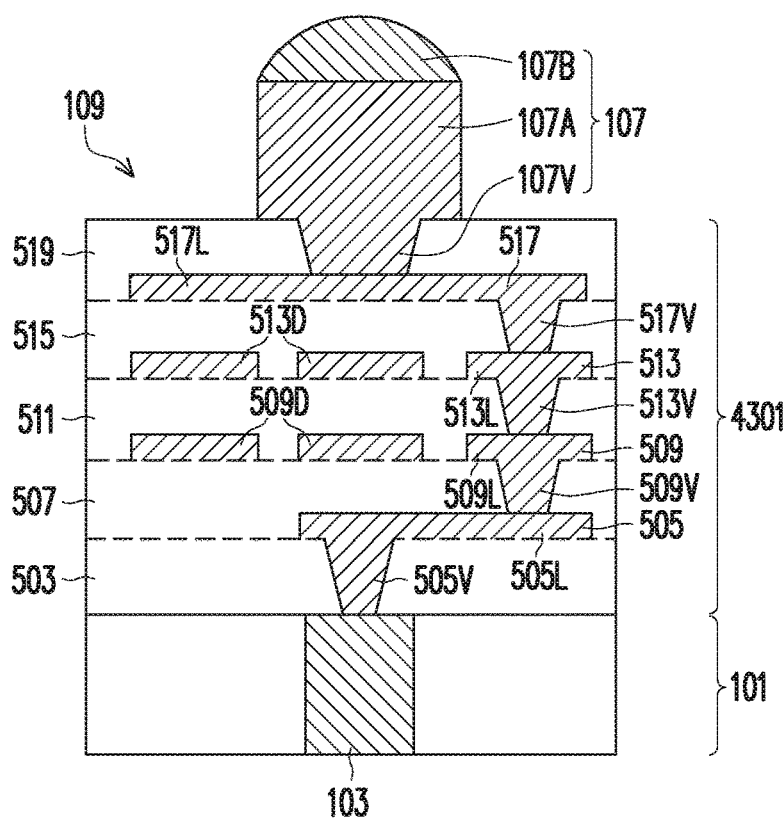

FIG. 43 illustrates a cross-sectional view of a portion 109 of the semiconductor device 100 (see FIG. 1A) in accordance with some embodiments. In the illustrated embodiment, a redistribution structure 4301 is implemented as the redistribution structure 105 of the semiconductor device 100 (see FIG. 1A). The redistribution structure 4301 includes insulating layers 503, 507, 511, 515 and 519; and metallization patterns 505, 509, 513 and 517. The structure of FIG. 43 is similar to the structure of FIG. 5, with similar features being labeled with similar numerical references, and descriptions of the similar features are not repeated herein. In some embodiments, the redistribution structure 4301 may be formed in a similar manner as the redistribution structure 501 described above with reference to FIG. 5, and the description is not repeated herein. In some embodiments, the redistribution structure 4301 comprises dummy conductive lines or traces 509D and 513D.

In the illustrated embodiment, the connector 103 is vertically aligned with respect to the via portion 107V of the connector 107 and is located directly below the via portion 107V of the connector 107. The vias 509V, 513V, and 517V are stacked and are laterally shifted with respect to the via 505V and the via portion 107V of the connector 107. By stacking and staggering the vias 505V, 509V, 513V and 517V in the redistribution structure 4301 as described above, a strain within the redistribution structure 4301 is reduced. Accordingly, generation of defects in the redistribution structure 4301 due to the strain is reduced or eliminated, which improves flexibility of circuit design for the redistribution structure, routing efficiency of the redistribution structure, and the reliability of a semiconductor device comprising the redistribution structure 4301.

Figure 44:
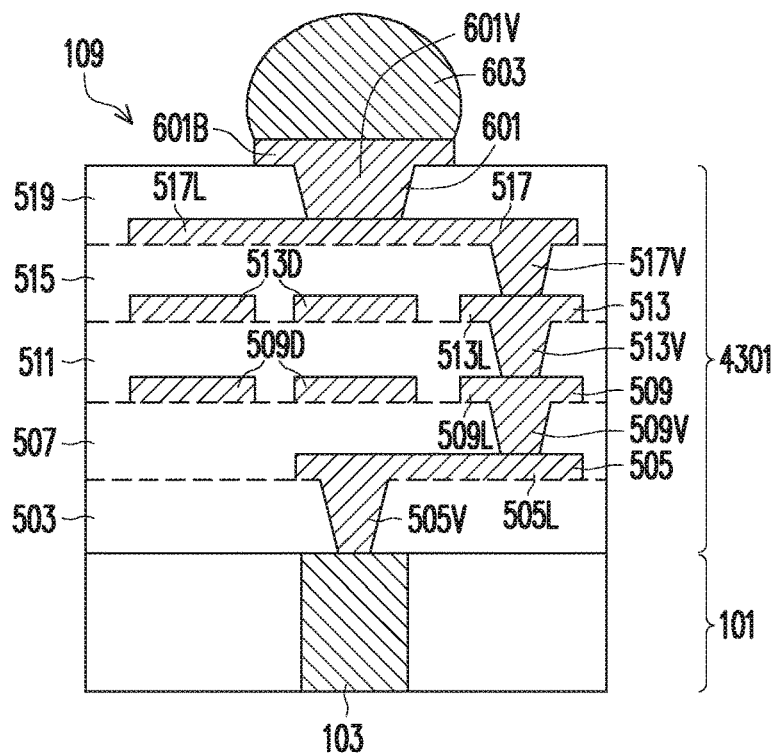

FIG. 44 illustrates a cross-sectional view of a portion 109 of the semiconductor device 100 (see FIG. 1A) in accordance with some embodiments. The structure illustrated in FIG. 44 is similar to the structure illustrated in FIG. 43, with similar features being labeled by similar numerical references, and descriptions of the similar features are not repeated herein. In the illustrated embodiment, after forming the redistribution structure 4301, UBMs 601 and connectors 603 are formed over the redistribution structure 4301 as described above with reference to FIG. 6, and the description is not repeated herein.

Figure 45:
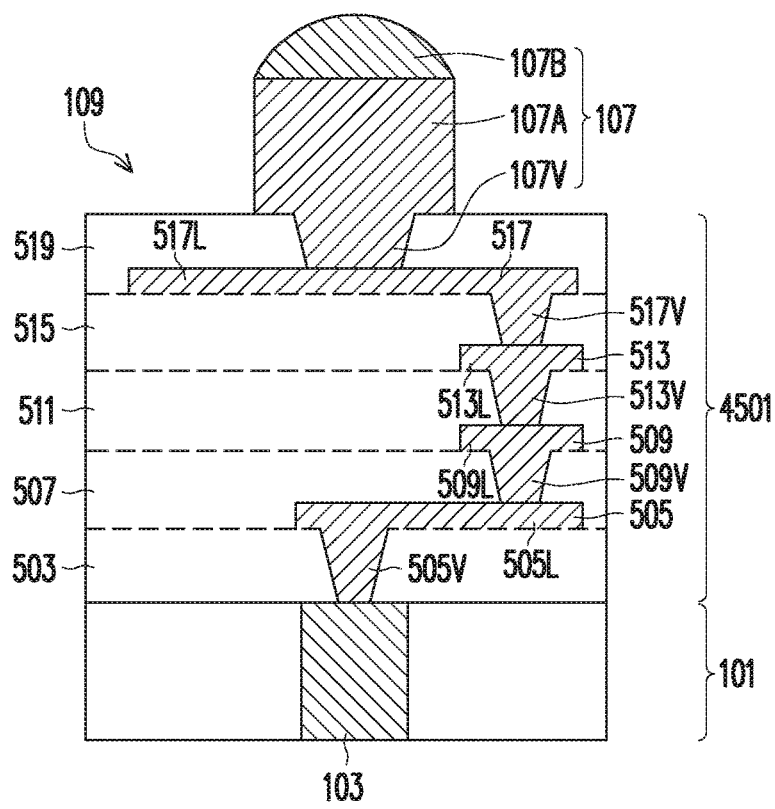

FIG. 45 illustrates a cross-sectional view of a portion 109 of the semiconductor device 100 (see FIG. 1A) in accordance with some embodiments. In the illustrated embodiment, a redistribution structure 4501 is implemented as the redistribution structure 105 of the semiconductor device 100 (see FIG. 1A). The redistribution structure 4501 includes insulating layers 503, 507, 511, 515 and 519; and metallization patterns 505, 509, 513 and 517. The structure of FIG. 45 is similar to the structure of FIG. 43, with similar features being labeled with similar numerical references, and descriptions of the similar features are not repeated herein. In some embodiments, the redistribution structure 4501 may be formed in a similar manner as the redistribution structure 501 described above with reference to FIG. 5, and the description is not repeated herein.

In the illustrated embodiment, the redistribution structure 4501 is similar to the redistribution structure 4301 (see FIG. 43) with the distinction that the redistribution structure 4501 does not comprise dummy conductive lines or traces (such as dummy conductive lines or traces 509D and 513D illustrated in FIG. 43). By stacking and staggering the vias 505V, 509V, 513V, and 517V in the redistribution structure 4501 as described above, a strain within the redistribution structure 4501 is reduced. Accordingly, generation of defects in the redistribution structure 4501 due to the strain is reduced or eliminated, which improves flexibility of circuit design for the redistribution structure, routing efficiency of the redistribution structure, and the reliability of a semiconductor device comprising the redistribution structure 4501.

Figure 46:
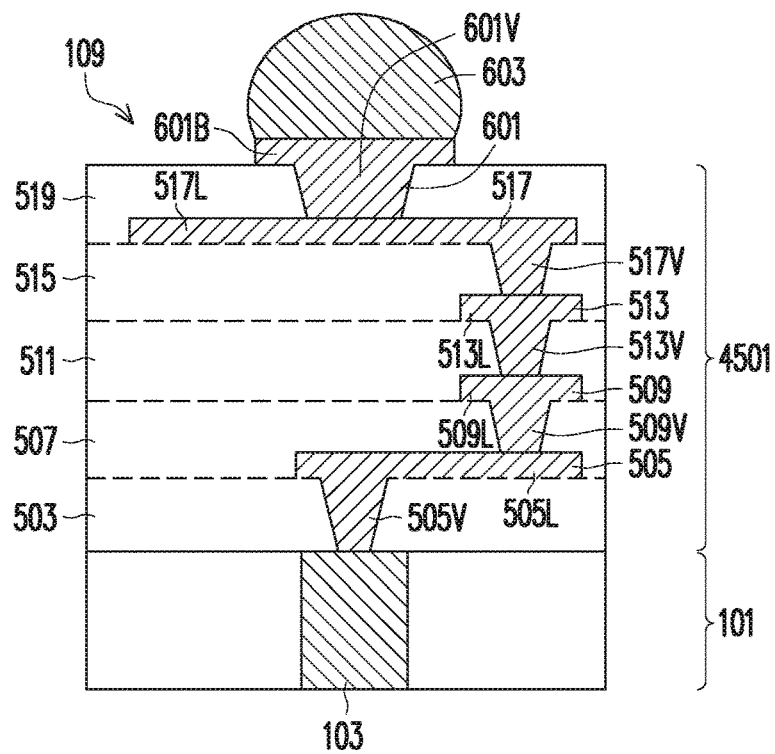

FIG. 46 illustrates a cross-sectional view of a portion 109 of the semiconductor device 100 (see FIG. 1A) in accordance with some embodiments. The structure illustrated in FIG. 46 is similar to the structure illustrated in FIG. 45, with similar features being labeled by similar numerical references, and descriptions of the similar features are not repeated herein. In the illustrated embodiment, after forming the redistribution structure 4501, UBMs 601 and connectors 603 are formed over the redistribution structure 4501 as described above with reference to FIG. 6, and the description is not repeated herein.

Figure 47:
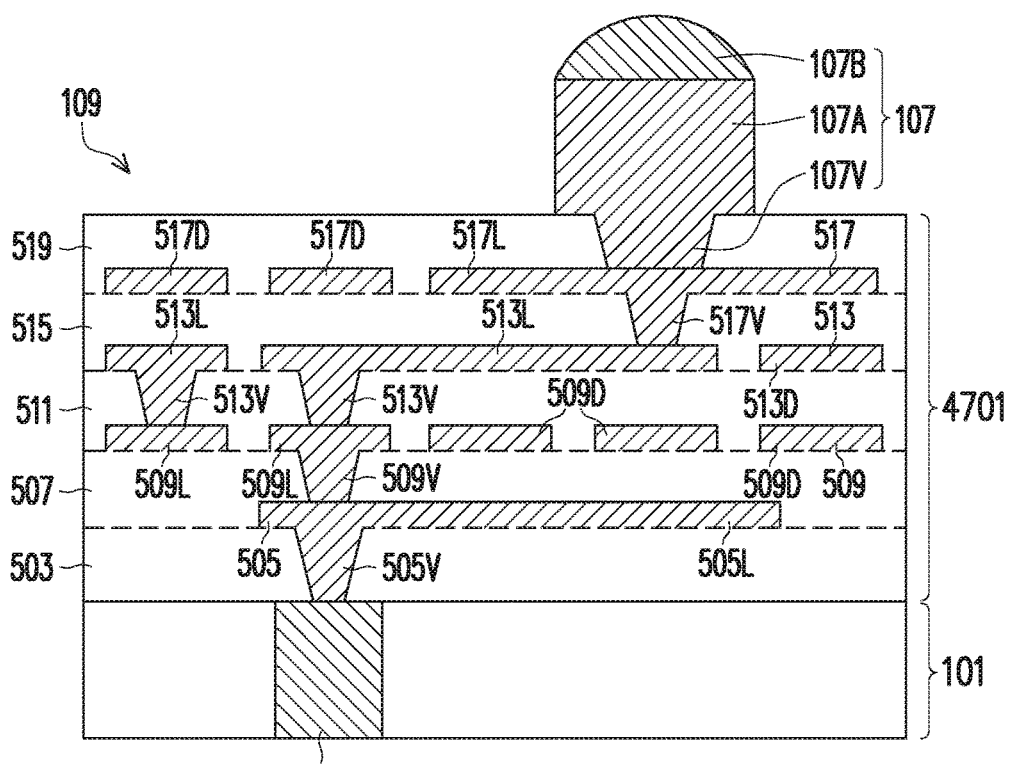

FIG. 47 illustrates a cross-sectional view of a portion 109 of the semiconductor device 100 (see FIG. 1A) in accordance with some embodiments. In the illustrated embodiment, a redistribution structure 4701 is implemented as the redistribution structure 105 of the semiconductor device 100 (see FIG. 1A). The redistribution structure 4701 includes insulating layers 503, 507, 511, 515 and 519; and metallization patterns 505, 509, 513 and 517. The structure of FIG. 47 is similar to the structure of FIG. 5, with similar features being labeled with similar numerical references, and descriptions of the similar features are not repeated herein. In some embodiments, the redistribution structure 4701 may be formed in a similar manner as the redistribution structure 501 described above with reference to FIG. 5, and the description is not repeated herein. In some embodiments, the redistribution structure 4701 comprises dummy conductive lines or traces 509D, 513D, and 517D.

In the illustrated embodiment, the connector 103 is laterally shifted with respect to the via portion 107V of the connector 107. The vias 505V, 509V, and 513V are vertically stacked over the connector 103, such that the via 505V fully lands on the connector 103. The via 517V and the via portion 107V of the connector 107 are vertically stacked. By stacking and staggering the vias 505V, 509V, 513V and 517V in the redistribution structure 4701 as described above, a strain within the redistribution structure 4701 is reduced. Accordingly, generation of defects in the redistribution structure 4701 due to the strain is reduced or eliminated, which improves flexibility of circuit design for the redistribution structure, routing efficiency of the redistribution structure, and the reliability of a semiconductor device comprising the redistribution structure 4701.

Figure 48:
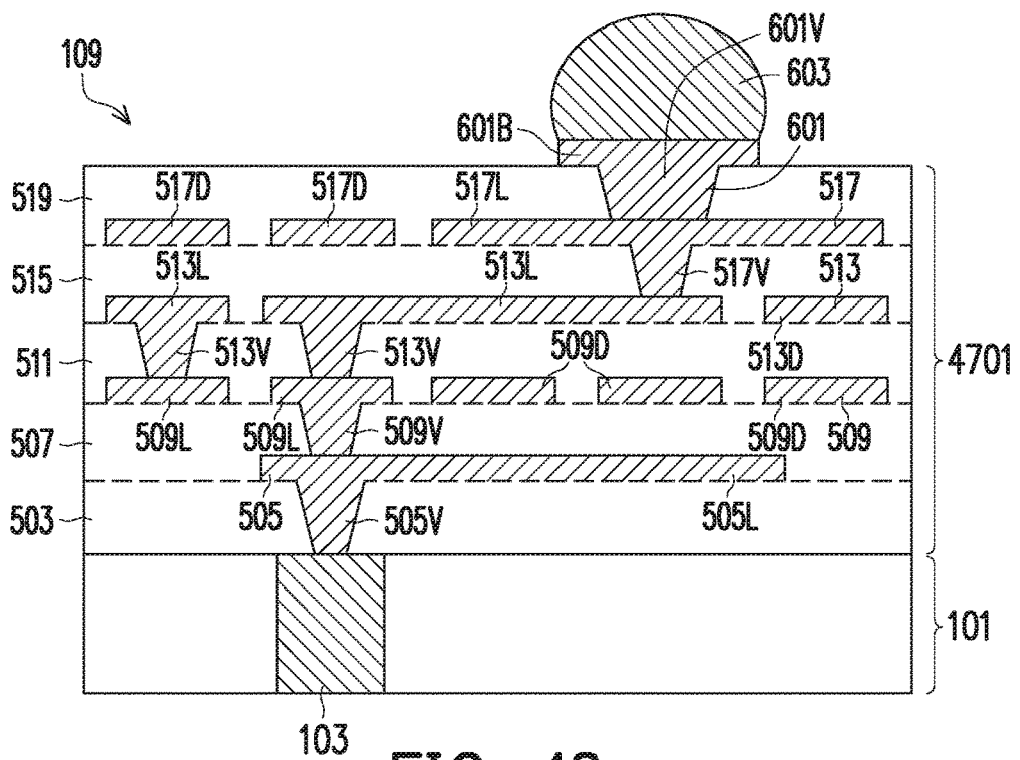

FIG. 48 illustrates a cross-sectional view of a portion 109 of the semiconductor device 100 (see FIG. 1A) in accordance with some embodiments. The structure illustrated in FIG. 48 is similar to the structure illustrated in FIG. 47, with similar features being labeled by similar numerical references, and descriptions of the similar features are not repeated herein. In the illustrated embodiment, after forming the redistribution structure 4701, UBMs 601 and connectors 603 are formed over the redistribution structure 4701 as described above with reference to FIG. 6, and the description is not repeated herein.

Figure 49:
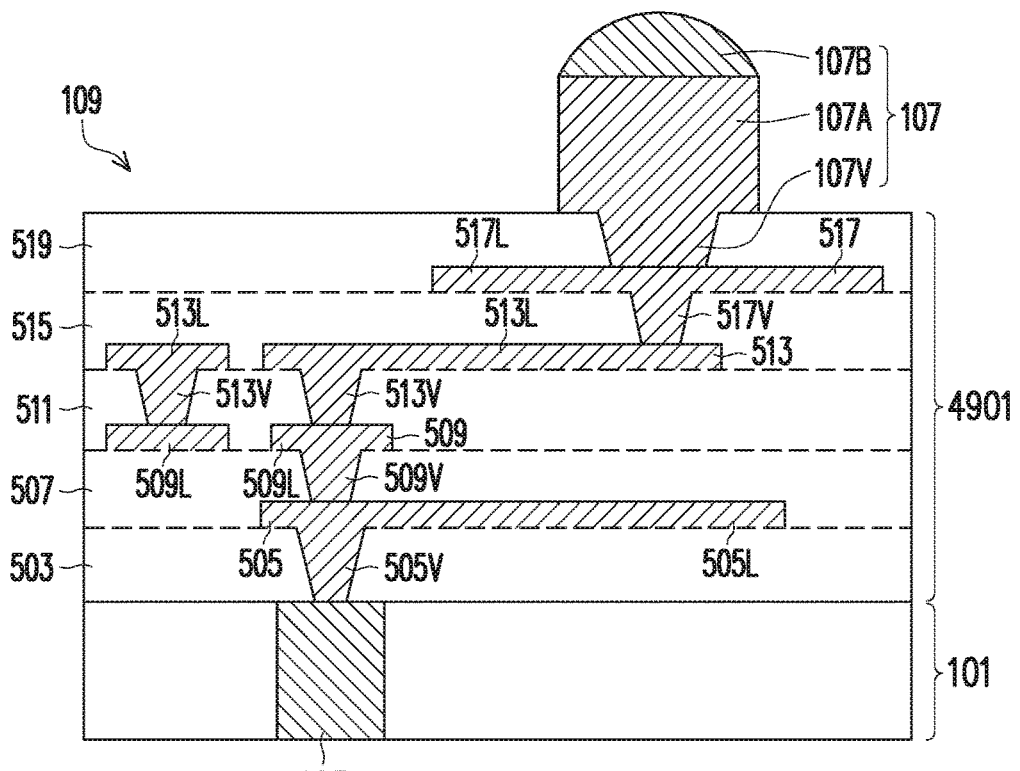

FIG. 49 illustrates a cross-sectional view of a portion 109 of the semiconductor device 100 (see FIG. 1A) in accordance with some embodiments. In the illustrated embodiment, a redistribution structure 4901 is implemented as the redistribution structure 105 of the semiconductor device 100 (see FIG. 1A). The redistribution structure 4901 includes insulating layers 503, 507, 511, 515 and 519; and metallization patterns 505, 509, 513 and 517. The structure of FIG. 49 is similar to the structure of FIG. 47, with similar features being labeled with similar numerical references, and descriptions of the similar features are not repeated herein. In some embodiments, the redistribution structure 4901 may be formed in a similar manner as the redistribution structure 501 described above with reference to FIG. 5, and the description is not repeated herein.

In the illustrated embodiment, the redistribution structure 4901 is similar with the redistribution structure 4701 (see FIG. 47) with the distinction that the redistribution structure 4901 does not comprise dummy conductive lines or traces (such as dummy conductive lines or traces 509D, 513D and 517D illustrated in FIG. 47). By stacking and staggering the vias 505V, 509V, 513V, and 517V in the redistribution structure 4901 as described above, a strain within the redistribution structure 4901 is reduced. Accordingly, generation of defects in the redistribution structure 4901 due to the strain is reduced or eliminated, which improves flexibility of circuit design for the redistribution structure, routing efficiency of the redistribution structure, and the reliability of a semiconductor device comprising the redistribution structure 4901.

Figure 50:
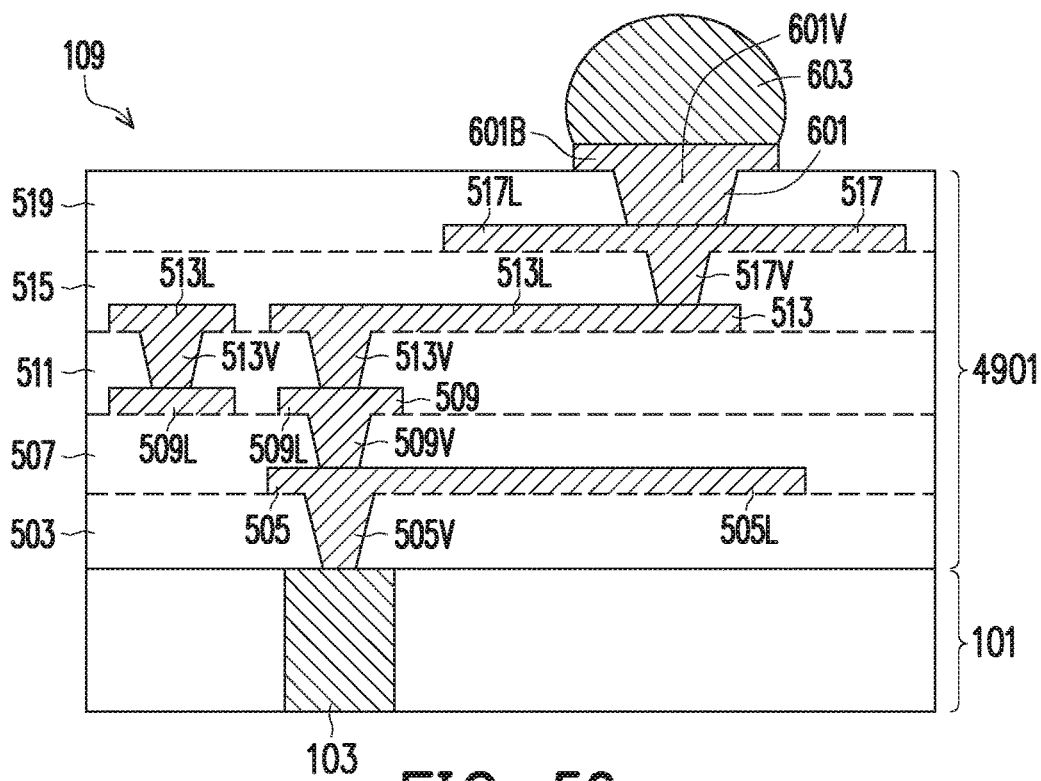

FIG. 50 illustrates a cross-sectional view of a portion 109 of the semiconductor device 100 (see FIG. 1A) in accordance with some embodiments. The structure illustrated in FIG. 50 is similar to the structure illustrated in FIG. 49, with similar features being labeled by similar numerical references, and descriptions of the similar features are not repeated herein. In the illustrated embodiment, after forming the redistribution structure 4901, UBMs 601 and connectors 603 are formed over the redistribution structure 4901 as described above with reference to FIG. 6, and the description is not repeated herein.

Figure 51:
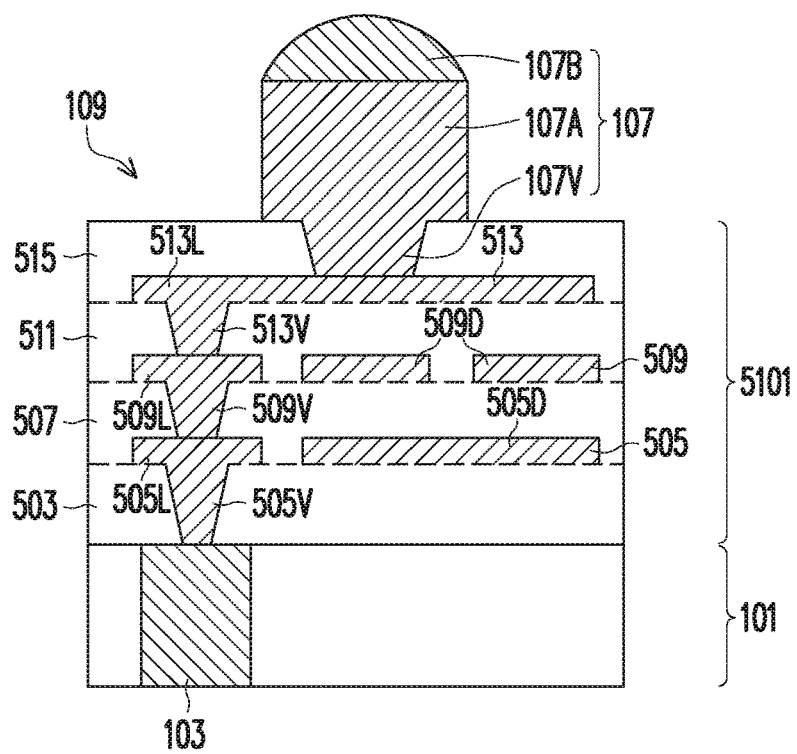

FIG. 51 illustrates a cross-sectional view of a portion 109 of the semiconductor device 100 (see FIG. 1A) in accordance with some embodiments. In the illustrated embodiment, a redistribution structure 5101 is implemented as the redistribution structure 105 of the semiconductor device 100 (see FIG. 1A). The redistribution structure 5101 includes insulating layers 503, 507, 511, and 515; and metallization patterns 505, 509, and 513. The structure of FIG. 51 is similar to the structure of FIG. 5, with similar features being labeled with similar numerical references, and descriptions of the similar features are not repeated herein. In some embodiments, the redistribution structure 5101 may be formed in a similar manner as the redistribution structure 501 described above with reference to FIG. 5, and the description is not repeated herein. In some embodiments, the redistribution structure 5101 comprises dummy conductive lines or traces 505D and 509D.

In the illustrated embodiment, the connector 103 is laterally shifted with respect to the via portion 107V of the connector 107. The vias 505V, 509V, and 513V are vertically stacked over the connector 103, such that the vias 505V fully lands on the connector 103. By stacking and staggering the vias 505V, 509V, and 513V in the redistribution structure 5101 as described above, a strain within the redistribution structure 5101 is reduced. Accordingly, generation of defects in the redistribution structure 5101 due to the strain is reduced or eliminated, which improves flexibility of circuit design for the redistribution structure, routing efficiency of the redistribution structure, and the reliability of a semiconductor device comprising the redistribution structure 5101.

Figure 52:
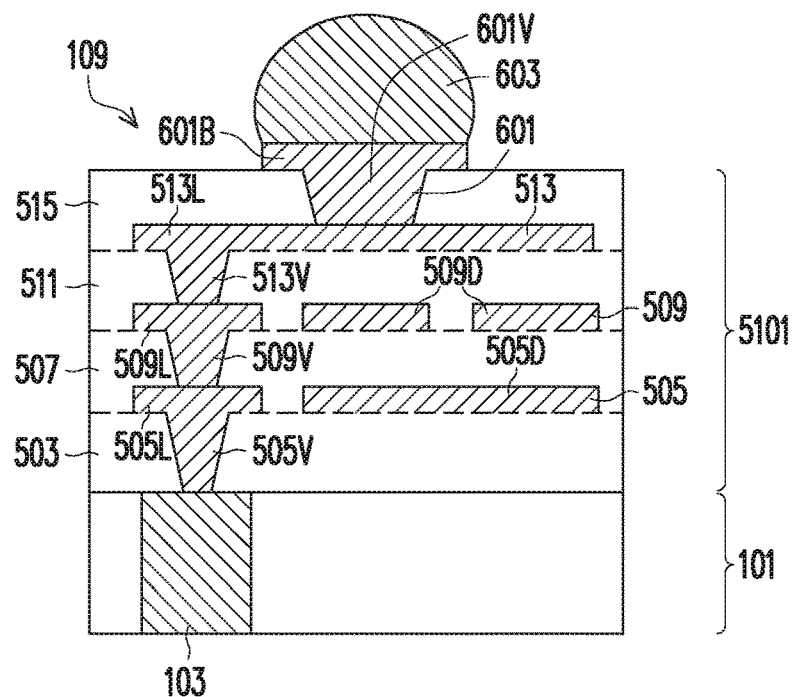

FIG. 52 illustrates a cross-sectional view of a portion 109 of the semiconductor device 100 (see FIG. 1A) in accordance with some embodiments. The structure illustrated in FIG. 52 is similar to the structure illustrated in FIG. 51, with similar features being labeled by similar numerical references, and descriptions of the similar features are not repeated herein. In the illustrated embodiment, after forming the redistribution structure 5101, UBMs 601 and connectors 603 are formed over the redistribution structure 5101 as described above with reference to FIG. 6, and the description is not repeated herein.

Figure 53:
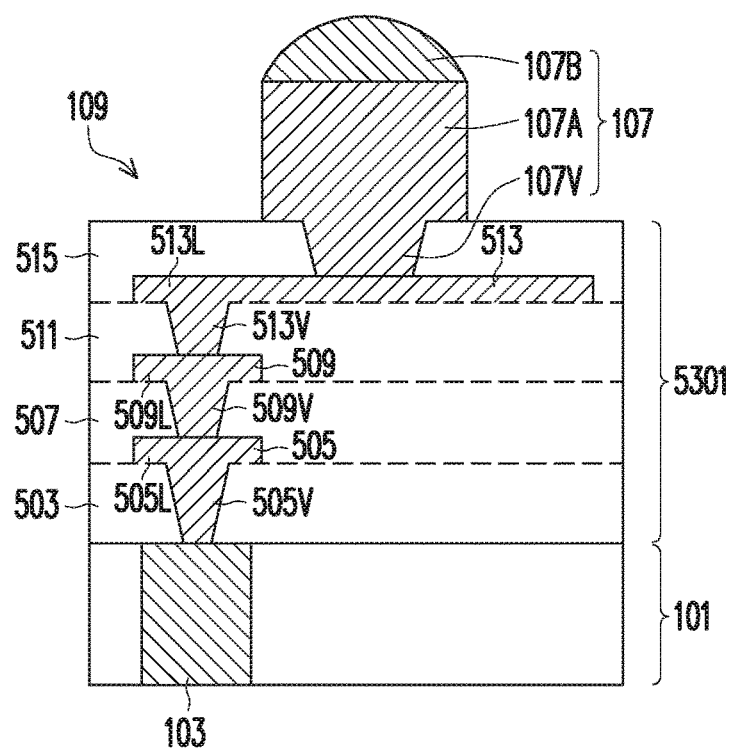

FIG. 53 illustrates a cross-sectional view of a portion 109 of the semiconductor device 100 (see FIG. 1A) in accordance with some embodiments. In the illustrated embodiment, a redistribution structure 5301 is implemented as the redistribution structure 105 of the semiconductor device 100 (see FIG. 1A). The redistribution structure 5301 includes insulating layers 503, 507, 511, and 515; and metallization patterns 505, 509, and 513. The structure of FIG. 53 is similar to the structure of FIG. 51, with similar features being labeled with similar numerical references, and descriptions of the similar features are not repeated herein. In some embodiments, the redistribution structure 5301 may be formed in a similar manner as the redistribution structure 501 described above with reference to FIG. 5, and the description is not repeated herein.

In the illustrated embodiment, the redistribution structure 5301 is similar to the redistribution structure 5101 (see FIG. 51) with the distinction that the redistribution structure 5301 does not comprise dummy conductive lines or traces (such as dummy conductive lines or traces 505D and 509D illustrated in FIG. 51). By stacking and staggering the vias 505V, 509V, and 513V in the redistribution structure 5301 as described above, a strain within the redistribution structure 5301 is reduced. Accordingly, generation of defects in the redistribution structure 5301 due to the strain is reduced or eliminated, which improves flexibility of circuit design for the redistribution structure, routing efficiency of the redistribution structure, and the reliability of a semiconductor device comprising the redistribution structure 5301.

Figure 54:
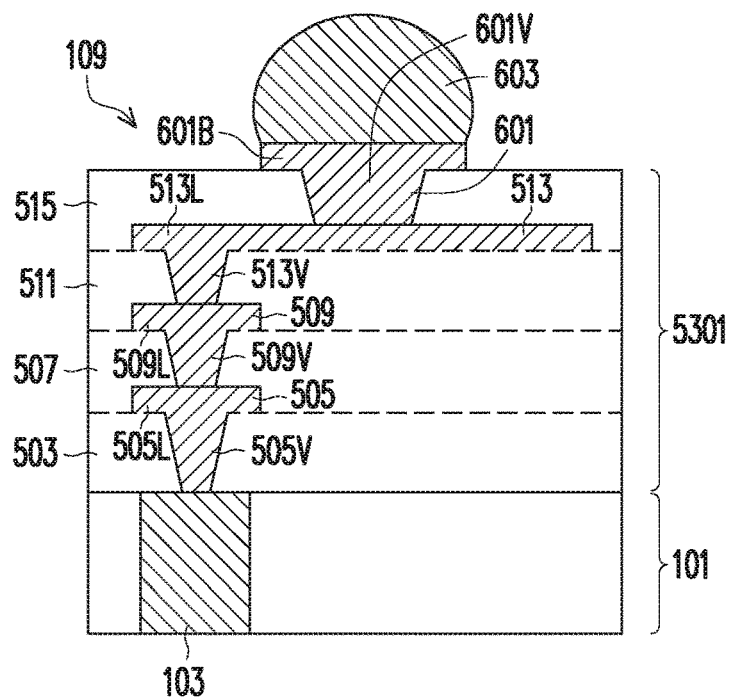

FIG. 54 illustrates a cross-sectional view of a portion 109 of the semiconductor device 100 (see FIG. 1A) in accordance with some embodiments. The structure illustrated in FIG. 54 is similar to the structure illustrated in FIG. 53, with similar features being labeled by similar numerical references, and descriptions of the similar features are not repeated herein. In the illustrated embodiment, after forming the redistribution structure 5301, UBMs 601 and connectors 603 are formed over the redistribution structure 5301 as described above with reference to FIG. 6, and the description is not repeated herein.

Figure 55:
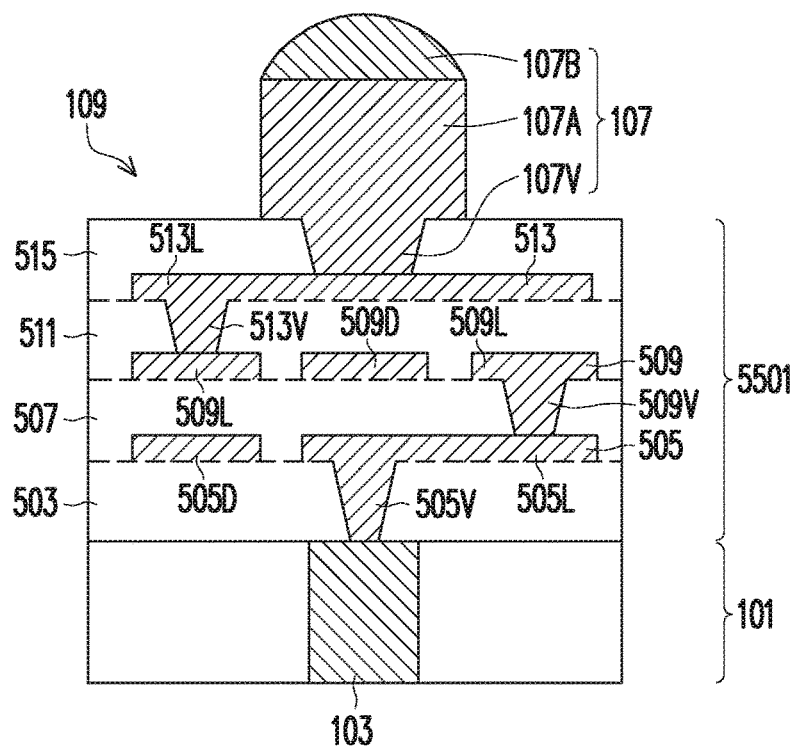

FIG. 55 illustrates a cross-sectional view of a portion 109 of the semiconductor device 100 (see FIG. 1A) in accordance with some embodiment, a redistribution structure 5501 is implemented as the redistribution structure 105 of the semiconductor device 100 (see FIG. 1A). The redistribution structure 5501 includes insulating layers 503, 507, 511, and 515; and metallization patterns 505, 509, and 513. The structure of FIG. 55 is similar to the structure of FIG. 5, with similar features being labeled with similar numerical references, and descriptions of the similar features are not repeated herein. In some embodiments, the redistribution structure 5501 may be formed in a similar manner as the redistribution structure 501 described above with reference to FIG. 5, and the description is not repeated herein. In some embodiments, the redistribution structure 5501 comprises dummy conductive lines or traces 505D and 509D.

In the illustrated embodiment, the connector 103 is vertically aligned with respect to the via portion 107V of the connector 107 and is located directly below the via portion 107V of the connector 107. The via 505V is over and fully lands on the connector. The via 509V is laterally shifted with respect to the via 505V and the via portion 107V of the connector 107. The via 513V is laterally shifted with respect to the via 505V, the via 509V, and the via portion 107V of the connector 107. By stacking and staggering the vias 505V, 509V, and 513V in the redistribution structure 5501 as described above, a strain within the redistribution structure 5501 is reduced. Accordingly, generation of defects in the redistribution structure 5501 due to the strain is reduced or eliminated, which improves flexibility of circuit design for the redistribution structure, routing efficiency of the redistribution structure, and the reliability of a semiconductor device comprising the redistribution structure 5501.

Figure 56:
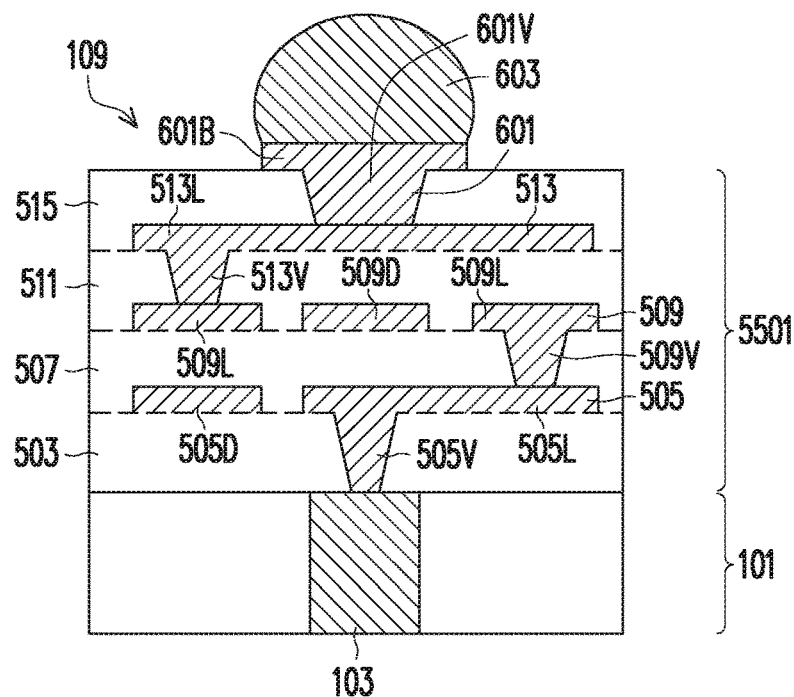

FIG. 56 illustrates a cross-sectional view of a portion 109 of the semiconductor device 100 (see FIG. 1A) in accordance with some embodiments. The structure illustrated in FIG. 56 is similar to the structure illustrated in FIG. 55, with similar features being labeled by similar numerical references, and descriptions of the similar features are not repeated herein. In the illustrated embodiment, after forming the redistribution structure 5501, UBMs 601 and connectors 603 are formed over the redistribution structure 5501 as described above with reference to FIG. 6, and the description is not repeated herein.

Figure 57:
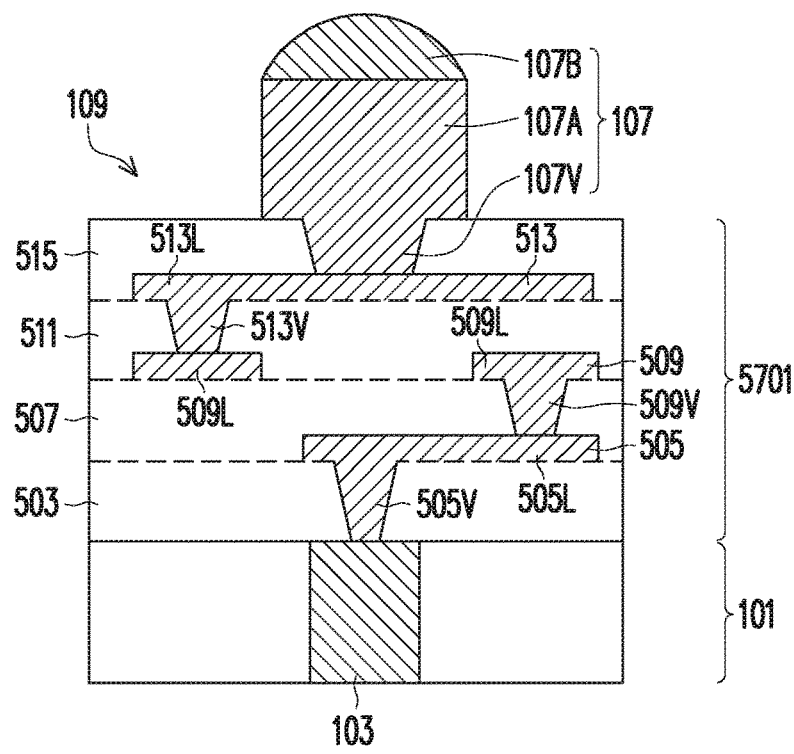

FIG. 57 illustrates a cross-sectional view of a portion 109 of the semiconductor device 100 (see FIG. 1A) in accordance with some embodiments. In the illustrated embodiment, a redistribution structure 5701 is implemented as the redistribution structure 105 of the semiconductor device 100 (see FIG. 1A). The redistribution structure 5701 includes insulating layers 503, 507, 511, and 515; and metallization patterns 505, 509, and 513. The structure of FIG. 57 is similar to the structure of FIG. 55, with similar features being labeled with similar numerical references, and descriptions of the similar features are not repeated herein. In some embodiments, the redistribution structure 5701 may be formed in a similar manner as the redistribution structure 501 described above with reference to FIG. 5, and the description is not repeated herein.

In the illustrated embodiment, the redistribution structure 5701 is similar to the redistribution structure 5501 (see FIG. 55) with the distinction that the redistribution structure 5701 does not comprise dummy conductive lines or traces (such as dummy conductive lines or traces 505D and 509D illustrated in FIG. 55). By stacking and staggering the vias 505V, 509V, and 513V in the redistribution structure 5701 as described above, a strain within the redistribution structure 5701 is reduced. Accordingly, generation of defects in the redistribution structure 5701 due to the strain is reduced or eliminated, which improves flexibility of circuit design for the redistribution structure, routing efficiency of the redistribution structure, and the reliability of a semiconductor device comprising the redistribution structure 5701.

Figure 58:
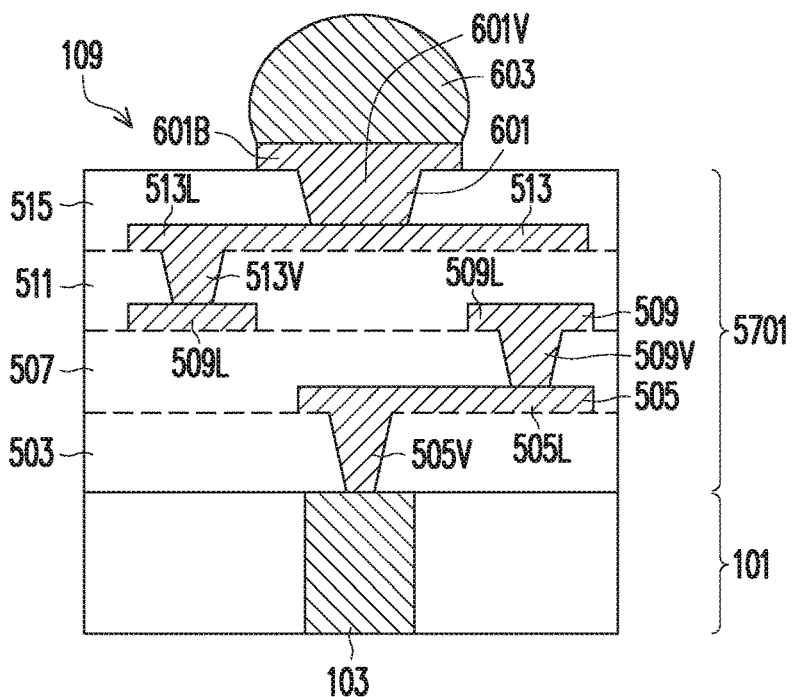

FIG. 58 illustrates a cross-sectional view of a portion 109 of the semiconductor device 100 (see FIG. 1A) in accordance with some embodiments. The structure illustrated in FIG. 58 is similar to the structure illustrated in FIG. 57, with similar features being labeled by similar numerical references, and descriptions of the similar features are not repeated herein. In the illustrated embodiment, after forming the redistribution structure 5701, UBMs 601 and connectors 603 are formed over the redistribution structure 5701 as described above with reference to FIG. 6, and the description is not repeated herein.

Figure 59:
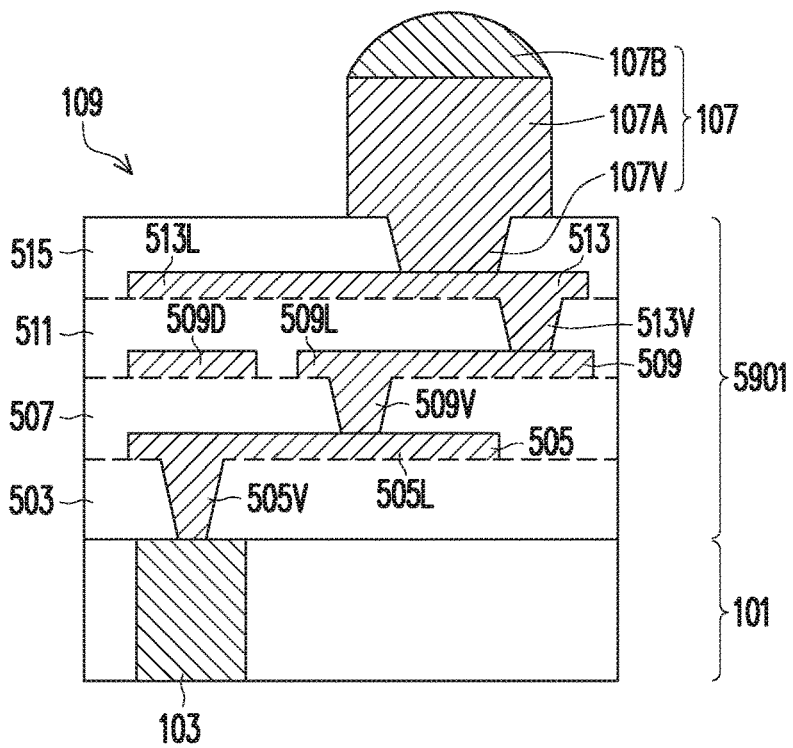

FIG. 59 illustrates a cross-sectional view of a portion 109 of the semiconductor device 100 (see FIG. 1A) in accordance with some embodiments. In the illustrated embodiment, a redistribution structure 5901 is implemented as the redistribution structure 105 of the semiconductor device 100 (see FIG. 1A). The redistribution structure 5901 includes insulating layers 503, 507, 511, and 515; and metallization patterns 505, 509, and 513. The structure of FIG. 59 is similar to the structure of FIG. 5, with similar features being labeled with similar numerical references, and descriptions of the similar features are not repeated herein. In some embodiments, the redistribution structure 5901 may be formed in a similar manner as the redistribution structure 501 described above with reference to FIG. 5, and the description is not repeated herein. In some embodiments, the redistribution structure 5901 comprises dummy conductive lines or traces 509D.

In the illustrated embodiment, the connector 103 is laterally shifted with respect to the via portion 107V of the connector 107. The via 505V is over and fully lands on the connector 107. The via 509V is laterally shifted with respect to the via 505V and the via portion 107V of the connector 107. The via 513V is laterally shifted with respect to the via 505V, the via 509V, and the via portion 107V of the connector 107. By stacking and staggering the vias 505V, 509V, and 513V in the redistribution structure 5901 as described above, a strain within the redistribution structure 5901 is reduced. Accordingly, generation of defects in the redistribution structure 5901 due to the strain is reduced or eliminated, which improves flexibility of circuit design for the redistribution structure, routing efficiency of the redistribution structure, and the reliability of a semiconductor device comprising the redistribution structure 5901.

Figure 60:
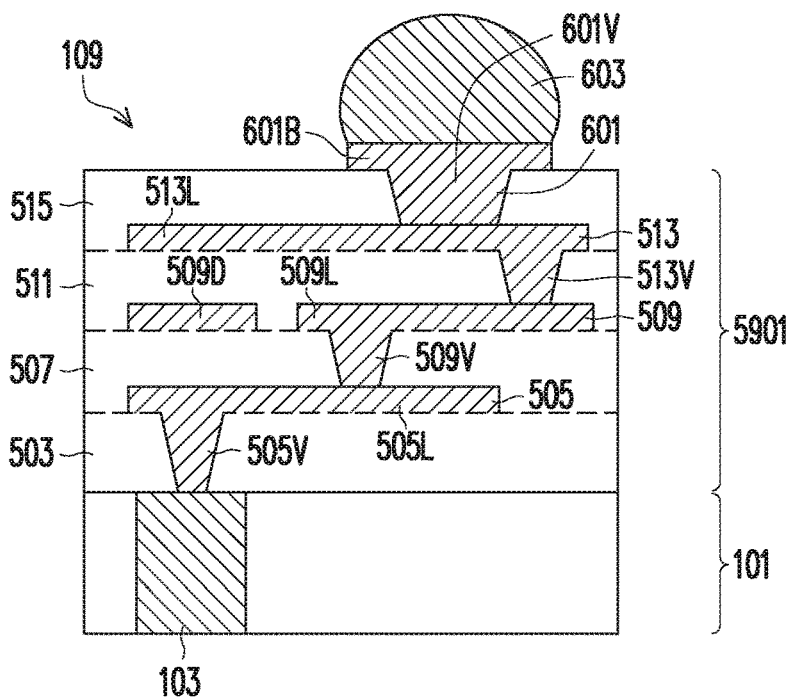

FIG. 60 illustrates a cross-sectional view of a portion 109 of the semiconductor device 100 (see FIG. 1A) in accordance with some embodiments. The structure illustrated in FIG. 60 is similar to the structure illustrated in FIG. 59, with similar features being labeled by similar numerical references, and descriptions of the similar features are not repeated herein. In the illustrated embodiment, after forming the redistribution structure 5901, UBMs 601 and connectors 603 are formed over the redistribution structure 5901 as described above with reference to FIG. 6, and the description is not repeated herein.

Figure 61:
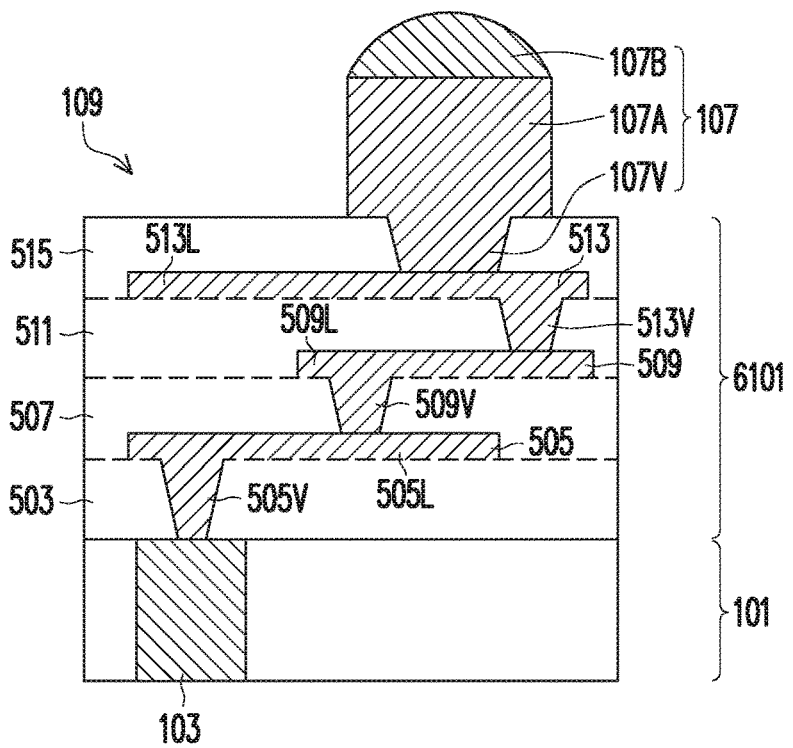

FIG. 61 illustrates a cross-sectional view of a portion 109 of the semiconductor device 100 (see FIG. 1A) in accordance with some embodiments. In the illustrated embodiment, a redistribution structure 6101 is implemented as the redistribution structure 105 of the semiconductor device 100 (see FIG. 1A). The redistribution structure 6101 includes insulating layers 503, 507, 511, and 515; and metallization patterns 505, 509, and 513. The structure of FIG. 61 is similar to the structure of FIG. 59, with similar features being labeled with similar numerical references, and descriptions of the similar features are not repeated herein. In some embodiments, the redistribution structure 6101 may be formed in a similar manner as the redistribution structure 501 described above with reference to FIG. 5, and the description is not repeated herein.

In the illustrated embodiment, the redistribution structure 6101 is similar to the redistribution structure 5901 (see FIG. 59) with the distinction that the redistribution structure 6101 does not comprise dummy conductive lines or traces (such as the dummy conductive line or trace 509D illustrated in FIG. 59). By stacking and staggering the vias 505V, 509V, and 513V in the redistribution structure 6101 as described above, a strain within the redistribution structure 6101 is reduced. Accordingly, generation of defects in the redistribution structure 6101 due to the strain is reduced or eliminated, which improves flexibility of circuit design for the redistribution structure, routing efficiency of the redistribution structure, and the reliability of a semiconductor device comprising the redistribution structure 6101.

Figure 62:
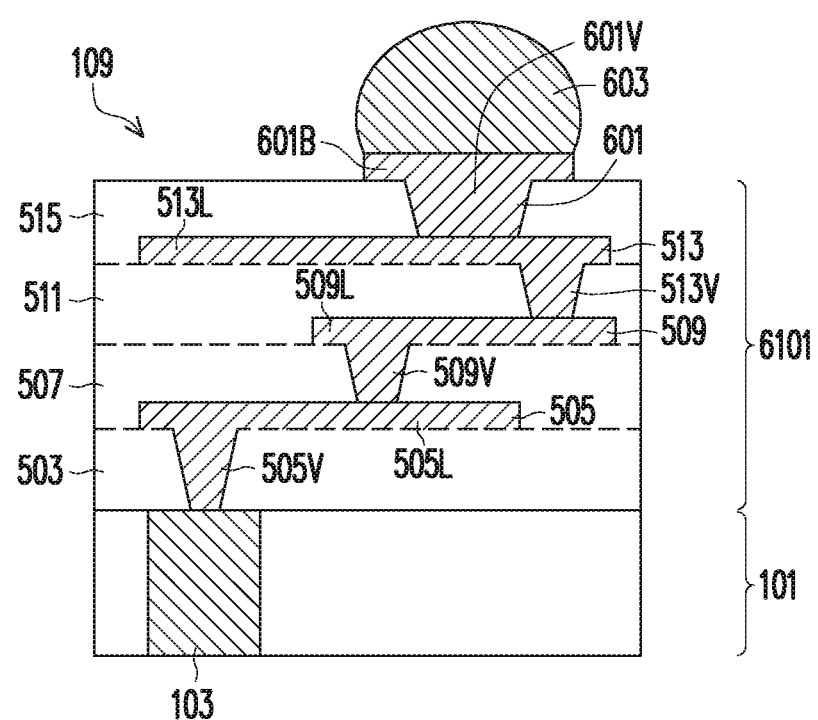

FIG. 62 illustrates a cross-sectional view of a portion 109 of the semiconductor device 100 (see FIG. 1A) in accordance with some embodiments. The structure illustrated in FIG. 62 is similar to the structure illustrated in FIG. 61, with similar features being labeled by similar numerical references, and descriptions of the similar features are not repeated herein. In the illustrated embodiment, after forming the redistribution structure 6101, UBMs 601 and connectors 603 are formed over the redistribution structure 6101 as described above with reference to FIG. 6, and the description is not repeated herein.

Referring further to FIGS. 1A and 1B, in some embodiments, via structures of the redistribution structure 105 as described above with reference to FIGS. 5-62 may be formed below each of the connectors 107 of the semiconductor device 100. In other embodiments, via structures of the redistribution structure 105 as described above with reference to FIGS. 5-62 may be formed below some of the connectors 107 of the semiconductor device 100. For example, via structures of the redistribution structure 105 as described above with reference to FIGS. 5-62 may be formed below one or more connectors 107 at a corner of the semiconductor device 100, one or more connectors 107 at an edge of the semiconductor device 100, or one or more connectors 107 in the interior of the semiconductor device 100. In some embodiments, via structures of the redistribution structure 105 as described above with reference to FIGS. 5-62 may be formed below the connectors 107 of the semiconductor device 100 at locations that are prone to increased strain (or example, at corners or edges of the semiconductor device 100) to reduce or eliminate the strain. Accordingly, generation of defects in the redistribution structure due to the strain is reduced or eliminated, flexibility of circuit design for the redistribution structure is improved, routing efficiency of the redistribution structure is improved, and the reliability of a semiconductor device comprising the redistribution structure is improved.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with an embodiment, a semiconductor device includes a semiconductor structure, a redistribution structure over and electrically coupled to the semiconductor structure, and a connector over and electrically coupled to the redistribution structure. The redistribution structure includes a base via, and stacked vias electrically interposed between the base via and the connector. The stacked vias are laterally spaced apart from the base via. In an embodiment, the stacked vias are directly below the connector. In an embodiment, the stacked vias are laterally spaced apart from the connector. In an embodiment, the stacked vias are laterally interposed between the base via and the connector. In an embodiment, the connector is laterally interposed between the base via and the stacked vias. In an embodiment, the redistribution structure further includes one or more dummy conductive lines. In an embodiment, the base via is laterally spaced apart from the connector.

In accordance with another embodiment, a semiconductor device includes a semiconductor structure, a redistribution structure over and physically coupled to the semiconductor structure, and a connector over and physically coupled to the redistribution structure. The redistribution structure includes a base via, and stacked vias electrically interposed between the base via and the connector. The stacked vias are laterally spaced apart from the connector. In an embodiment, the stacked vias are laterally spaced apart from the base via. In an embodiment, the redistribution structure is free from dummy conductive features. In an embodiment, the connector is disposed at a corner of the redistribution structure in a plan view. In an embodiment, the connector is disposed at an edge of the redistribution structure in a plan view. In an embodiment, the base via is in physical contact with the semiconductor structure. In an embodiment, the base via is vertically aligned with the connector.

In accordance with yet another embodiment, a method includes forming a redistribution structure over a semiconductor structure, and forming a connector over the redistribution structure. Forming the redistribution structure includes forming a base via over the semiconductor structure, and forming stacked vias over the base via. The stacked vias are laterally spaced apart from the base via. In an embodiment, forming the redistribution structure further includes forming one or more dummy conductive lines. In an embodiment, the stacked vias are vertically aligned with the connector. In an embodiment, the stacked vias are laterally spaced apart from the connector. In an embodiment, the base via has a sloped sidewall. In an embodiment, the base via is laterally spaced apart from the connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a redistribution structure over a semiconductor structure, wherein the semiconductor structure comprises a first connector, wherein forming the redistribution structure comprises:
 forming a first insulating layer directly on the semiconductor structure;
 forming a first metallization pattern, the first metallization pattern comprising a base via and a first redistribution line, the base via extending through the first insulating layer over the first connector of the semiconductor structure; and
 forming stacked vias over the first insulating layer, the stacked vias being electrically coupled to the base via, wherein a first via of the stacked vias physically contacts the first redistribution line, the stacked vias overlapping each other; and
forming a second connector over the redistribution structure, wherein the stacked vias electrically couple the first connector to the second connector, wherein the stacked vias are laterally between the first connector and the second connector in a cross-sectional view.

2. The method of claim 1, wherein the stacked vias are completely non-overlapping the base via.

3. The method of claim 1, wherein the stacked vias are completely non-overlapping the first connector and the second connector in the cross-sectional view.

4. The method of claim 1, wherein forming the redistribution structure further comprises:
 forming a dummy line, the dummy line being adjacent a first conductive line between a first stacked via and a second stacked via of the stacked vias, wherein the first stacked via and the second stacked via are adjacent vias of the stacked vias.

5. The method of claim 4, wherein forming the redistribution structure further comprises:
 forming a second conductive line between a third stacked via and a fourth stacked via of the stacked vias, wherein the second conductive line overlaps the dummy line.

6. The method of claim 1, wherein the base via has a first width at a first distance from the semiconductor structure and a second width at a second distance from the semiconductor structure, the first width being less than the second width, the first distance being less than the second distance.

7. The method of claim 1, wherein a width of the base via is less than a width of the first connector.

8. A method comprising:
forming a redistribution structure over a semiconductor structure, wherein the semiconductor structure comprises a first connector, wherein forming the redistribution structure comprises:
 forming a first insulating layer directly on the semiconductor structure;
 forming a first metallization pattern, the first metallization pattern comprising a base via and a first redistribution line, the base via extending through the first insulating layer over the first connector of the semiconductor structure; and
 forming stacked vias over the first insulating layer, the stacked vias being electrically coupled to the base via, wherein the stacked vias overlap each other, wherein a first via of the stacked vias physically contacts the first redistribution line; and
forming a second connector over the redistribution structure, wherein the stacked vias electrically couple the first connector to the second connector, wherein the stacked vias are laterally spaced apart from the first connector and the second connector in a cross-sectional view.

9. The method of claim 8, wherein the stacked vias are completely non-overlapping the base via.

10. The method of claim 9, wherein the stacked vias are completely non-overlapping the first connector.

11. The method of claim 8, wherein the stacked vias are completely non-overlapping the first connector and the second connector in the cross-sectional view.

12. The method of claim 8, wherein the stacked vias are laterally between the first connector and the base via.

13. The method of claim 8, wherein the second connector is laterally between the stacked vias and the base via.

14. The method of claim 8, wherein the second connector overlaps the base via.

15. A semiconductor device comprising:
a redistribution structure over a semiconductor structure, wherein the semiconductor structure comprises a first connector, wherein the redistribution structure comprises:
 a first insulating layer directly on the semiconductor structure;
 a first metallization pattern, the first metallization pattern comprising a base via and a first redistribution line, the base via extending through the first insulating layer to physically contact the first connector; and
 stacked vias over the first insulating layer, the stacked vias being electrically coupled to the base via, wherein a first via of the stacked vias physically contacts the first redistribution line, the stacked vias overlapping each other; and
a second connector over the redistribution structure, wherein the stacked vias electrically couple the first connector to the second connector, wherein the stacked vias are completely spaced apart from the first connector and the second connector in a cross-sectional view.

16. The semiconductor device of claim 15, wherein the stacked vias are laterally between the first connector and the second connector.

17. The semiconductor device of claim 15, wherein the second connector is laterally between the stacked vias and the first connector via in the cross-sectional view.

18. The semiconductor device of claim 15, further comprising a dummy line, wherein the dummy line overlaps the base via.

19. The semiconductor device of claim 15, wherein the redistribution structure further comprises a second redistribution line between a first stacked via and a second stacked via of the stacked vias, wherein the second redistribution line electrically couples the first stacked via to the second stacked via of the stacked vias, wherein the second redistribution line overlaps the base via.

20. The semiconductor device of claim 15, wherein the second connector overlaps the first connector.

* * * * *